(12) United States Patent
Wang et al.

(10) Patent No.: US 11,818,479 B2
(45) Date of Patent: Nov. 14, 2023

(54) SIGMA DELTA QUANTIZATION FOR IMAGES

(71) Applicant: Board of Trustees of Michigan State University, East Lansing, MI (US)

(72) Inventors: Rongrong Wang, East Lansing, MI (US); He Lyu, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 140 days.

(21) Appl. No.: 17/320,700

(22) Filed: May 14, 2021

(65) Prior Publication Data

US 2021/0368115 A1 Nov. 25, 2021

Related U.S. Application Data

(60) Provisional application No. 63/024,861, filed on May 14, 2020.

(51) Int. Cl.
| | | |
|---|---|---|
| H04N 5/232 | (2006.01) | |
| H04N 25/70 | (2023.01) | |
| H03M 1/12 | (2006.01) | |
| H03M 3/00 | (2006.01) | |
| H04N 25/75 | (2023.01) | |

(52) U.S. Cl.
CPC ............. *H04N 25/70* (2023.01); *H03M 1/12* (2013.01); *H03M 3/458* (2013.01); *H04N 25/75* (2023.01)

(58) Field of Classification Search
None
See application file for complete search history.

(56) References Cited

U.S. PATENT DOCUMENTS

| | | | |
|---|---|---|---|
| 7,545,300 B2 | 6/2009 | Boemler | |
| RE42,739 E * | 9/2011 | Fortier | ................. H04N 25/533 348/308 |
| 8,289,428 B2 | 10/2012 | Boemler | |
| 8,687,689 B2 | 4/2014 | Baraniuk et al. | |
| 8,928,511 B2 | 1/2015 | Lin et al. | |
| 9,219,495 B2 | 12/2015 | Si | |
| 9,277,215 B2 | 3/2016 | Zheng et al. | |
| 9,369,651 B2 | 6/2016 | Petilli | |

(Continued)

FOREIGN PATENT DOCUMENTS

EP 1488525 B1 8/2010

OTHER PUBLICATIONS

J. J. Benedetto, A. M. Powell, Ö. Yilmaz, "Sigma-Delta quantization and finite frames", IEEE Transactions on Information Theory. May 2006.

(Continued)

*Primary Examiner* — Twyler L Haskins
*Assistant Examiner* — Wesley J Chiu
(74) *Attorney, Agent, or Firm* — Harness, Dickey & Pierce, PLC

(57) ABSTRACT

A technique is presented for quantizing pixels of an image using Sigma Delta quantization. In one aspect, pixel values for an image are segmented into columns of pixel values; and for each column in the matrix, pixel values of a given column are quantized using sigma delta modulation. The pixel values in a given column are preferably quantized as a whole, thereby minimizing accumulated quantization error from a starting pixel value in the given column to a current pixel value in the given column. In another aspect, the pixels of an image are quantized using a 2D generalization of Sigma Delta modulation.

10 Claims, 8 Drawing Sheets

(56) References Cited

U.S. PATENT DOCUMENTS

| | | | |
|---|---|---|---|
| 10,230,964 B2 | 3/2019 | Sato | |
| 10,812,790 B2 | 10/2020 | Nagumo | |
| 2002/0100921 A1* | 8/2002 | Mabuchi | H04N 25/445 348/E5.079 |
| 2009/0033779 A1* | 2/2009 | Mo | H04N 25/75 348/308 |
| 2011/0128433 A1* | 6/2011 | Shiohara | H04N 23/63 348/333.09 |
| 2014/0266827 A1* | 9/2014 | Ceballos | H03M 3/418 341/143 |
| 2017/0048537 A1* | 2/2017 | Boufounos | H04N 19/395 |
| 2018/0165255 A1* | 6/2018 | Gafford | G06F 40/169 |
| 2020/0336743 A1 | 10/2020 | Kondo | |

OTHER PUBLICATIONS

J. Blum, M. Lammers, A. M. Powell, Ö. Yilmaz, "Sobolev duals in frame theory and sigma-delta quantization", Springer, Journal of Fourier Analysis and Applications, Oct. 15, 2009.

I. Daubechies, R. DeVore, "Approximating a bandlimited function using very coarsely quantized data: A family of stable sigma-delta modulators of arbitrary order" JSTOR, Annals of mathematics. Sep. 2003.

M. Lammers, A. M. Powell, Ö. Yilmaz, "Alternative dual frames for digital-to-analog conversion in sigma-delta quantization", Springer, Advances in Computational Mathematics. Jul. 19, 2008.

R. Saab, R. Wang, Ö. Yilmaz, "From compressed sensing to compressed bit-streams: practical encoders, tractable decoders", IEEE, IEEE Transactions on Information Theory. Jul. 26, 2017.

R. Saab, R. Wang, Ö. Yilmaz, "Quantization of compressive samples with stable and robust recovery", Elsevier, Applied and Computational Harmonic Analysis. Jan. 2018.

L. Yue, P. Ganesan, B.S. Sathish, C. Manikandan, A. Niranjan, V. Elamaran, A.F. Hussein, "The importance of dithering technique revisited with biomedical images—a survey", IEEE, IEEE Access. Dec. 18, 2018.

B. W. Kolpatzik, C. A. Bouman, "Optimized error diffusion for image display", International Society for Optics and Photonics, Journal of Electronic Imaging. Jul. 1, 1992.

* cited by examiner

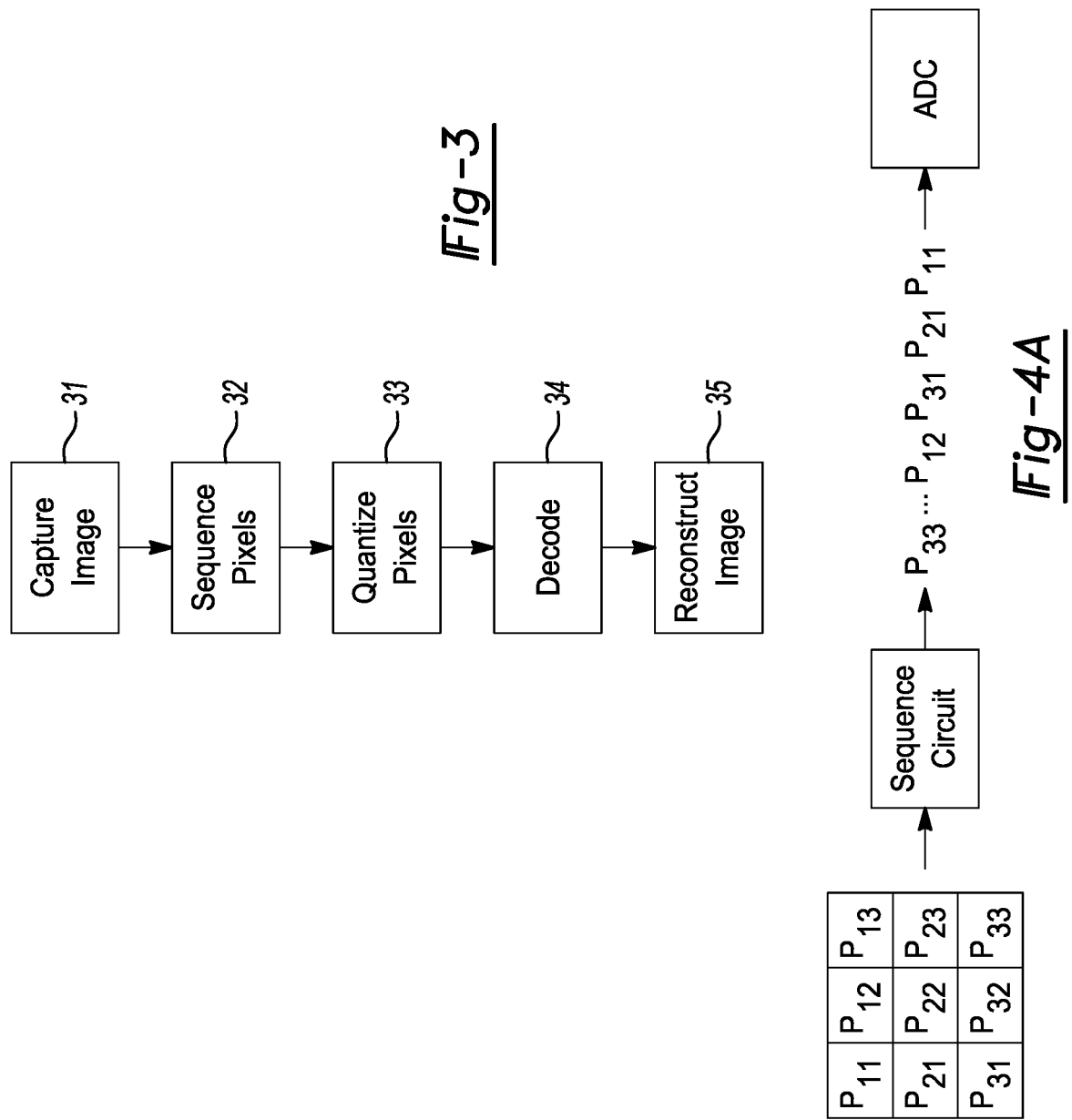

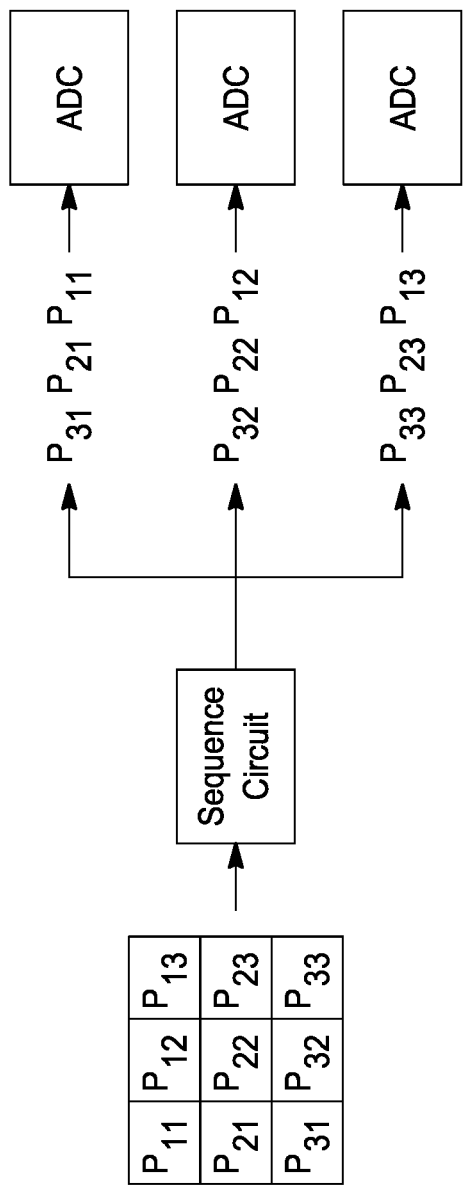
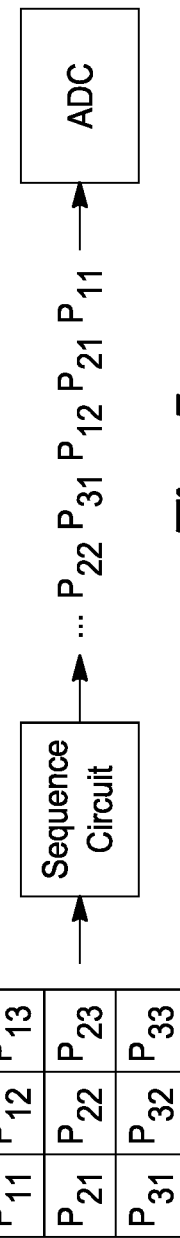
Fig-4B
Fig-5

SIGMA DELTA QUANTIZATION FOR IMAGES

CROSS-REFERENCE TO RELATED APPLICATIONS

This application claims the benefit of U.S. Provisional Application No. 63/024,861, filed on May 14, 2020. The entire disclosure of the above application is incorporated herein by reference.

GOVERNMENT CLAUSE

This invention was made with government support under CCF1909523 awarded by the National Science Foundation. The government has certain rights in the invention.

FIELD

The present disclosure relates to techniques quantizing pixels of an image.

BACKGROUND

In digital signal processing, quantization is the step of converting a signal's real-valued samples into a finite string of bits. As the first step in digital processing, it plays a crucial role in determining the information conversion rate and the reconstruction quality. Mathematically, given a signal class $\mathcal{S} \subseteq \mathbb{R}^N$ and a fixed codebook $\mathcal{C}$, the goal of the quantization is to find for every signal x in $\mathcal{S}$ a codebook representation $q \in \mathcal{C}$ so that it can be stored digitally. Q is used to denote the quantization map between the signal space $\mathcal{S}$ and the codebook $\mathcal{C}$ $$Q: \mathcal{S} \to \mathcal{C}: x \to q.$$

Quantization schemes are usually equipped with reconstructing algorithms, that can reconstruct the original signal from the encoded bits. To ensure practicability, the reconstruction algorithms have to be solvable in polynomial times. More explicitly, the algorithm, denoted by $\Delta$, should be able to reconstruct every signal $x \in \mathcal{S}$ from their encoded vector q in polynomial time up to some small distortion $$\text{Distortion}:=\|\hat{x}-x\|_2 = \|\Delta(q)-x\|_2.$$

For a given signal class $\mathcal{S}$, define the optimal quantization Q to be the one optimizing the bit rate distortion defined as the minimal possible distortion under a fixed bit budget. Let R be the fixed budget, among all codebook $\mathcal{C}$ representable in R bits, the optimal quantization Q is the one that minimizes the minimax distortion $$\hat{Q} = \arg\min_{Q: \mathcal{S} \to \mathcal{C}, |\mathcal{C}|=2^R} \min_{\Delta \in \mathcal{D}} \max_{x \in \mathcal{S}} \|\Delta \cdot Q(x) - x\|_2, \quad (x)$$

where $\mathcal{D}$ is the class of polynomial time decoders.

If the signal class $\mathcal{S}$ forms a compact metric space, one can find the optimal quantizer using an information theoretical argument. Given a fixed approximation error $\epsilon$, one can find infinitely many $\epsilon$-nets of $\mathcal{S}$. The smallest possible cardinality of the $\epsilon$-nets is called the covering number $N(\epsilon)$. Suppose such an optimal $\epsilon$-net is given, define the quantization Q as the map that sends every point in $\mathcal{S}$ to the center of the $\epsilon$-ball containing this point. Using the binary representation, the number of bits needed to encode the centers is $R=\log_2 N(\epsilon)$. This relation reduces to $\epsilon \sim 2^{-R/d}$ when $\mathcal{S}$ is the $\ell_2$ ball in $\mathbb{R}^d$ see, e.g.,[19]), where $\sim$ means the two sides are equal to each other up to some constant. This relation $\epsilon \sim 2^{-R/d}$ is called the exponential relation, which is the best decay rate for $\epsilon$ as R increases. However, this optimal quantization scheme suffers from the following impracticality: 1) unless $\mathcal{S}$ has a regular shape, finding the $\epsilon$-covering for $\mathcal{S}$ suffers from the curse of dimensionality; 2) the scheme cannot be operated in an online manner as the nearest center of x can only be found after all samples of x have been received; and 3) if extra samples come in, the $\epsilon$-net needs to be recalculated.

These concerns inspire people to impose the following practical requirements on the quantizer Q. The quantization q should have the same size as the signal x. Q should quantize each entry of x to an entry of q in an online manner, which means $q_i$ (the ith entry of q) only depends on the historial inputs $x_1, \ldots, x_i$ not the future ones. The alphabets $\mathcal{A}_i$ for each $q_i$ are the same and fixed in advance, i.e., $\mathcal{A}_1 = \ldots \mathcal{A}_n = \mathcal{A}$. Together they form the codebook $\mathcal{C} = \mathcal{A}^n$. As the quantization is implemented in the analog hardware, the mathematical operations should be kept as simple as possible. In particular, addition/subtraction are much more preferred circuit operations than multiplication/division. Here, for simplicity, alphabet $\mathcal{A}$ is chosen from the class of finite equal-spacing grids with step-size $\delta$, $$\mathcal{A}_\delta = \{c + J\delta, c \in \mathbb{R}, J \in \mathbb{Z}\}_{J_1 < J < J_2} \quad (1.1)$$

This section provides background information related to the present disclosure which is not necessarily prior art.

SUMMARY

This section provides a general summary of the disclosure, and is not a comprehensive disclosure of its full scope or all of its features.

In one aspect, a technique is presented for quantizing pixels of an image using 1D Sigma Delta quantization. The method includes: receiving pixel values for an image captured by an imager at a sequencing circuit; segmenting or sequencing the pixel values of the matrix into columns of pixel values; and for each column in the matrix, quantizing pixel values of a given column using sigma delta modulation. The pixel values in a given column are preferably quantized as a whole, thereby minimizing accumulated quantization error from a starting pixel value in the given column to a current pixel value in the given column. The quantized values for each column may be assembled into a rectangular array and stored as a final image in a non-transitory computer-readable medium. Alternatively or additionally, a final image may be reconstructed from the quantized pixel values of the matrix using a decoder, where the decoder is configured to minimize an image norm during reconstruction.

In another aspect, a technique is presented for quantizing pixels of an image using a 2D generalization of Sigma Delta modulation. The method includes: receiving pixel values for an image captured by an imager at a sequencing circuit; segmenting the pixel values of the matrix into one or more patches of pixel values, where each patch of pixel values is subset of pixel values from the matrix arranged in a two dimensional array; and for each patch in the matrix, quantizing the pixel values of a given patch using a two dimensional generalization of sigma delta modulation.

In one embodiment, segmenting the pixel values of the matrix further includes creating a sequence of pixel values for a given patch by sequencing pixel values along antidiagonals of the two dimensional array starting from an upper left corner of the given patch and moving to the lower right corner of the given patch. The sequence of pixel values for a given patch are then quantized by summing quantization errors associated with at least three pixels neighboring pixels the given pixel and rounding sum to nearest member of an alphabet.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 3 is a flowchart depicting a technique for quantizing pixels of an image;

FIG. 4A is a diagram illustrating how to sequence pixel vales of an image column wise and in series;

FIG. 4B is a diagram illustrating how to sequence pixel vales of an image column wise and in parallel;

FIG. 5 is a diagram illustrating how to sequence pixel values from a patch;

Corresponding reference numerals indicate corresponding parts throughout the several views of the drawings.

DETAILED DESCRIPTION

Example embodiments will now be described more fully with reference to the accompanying drawings.

Figure 1:
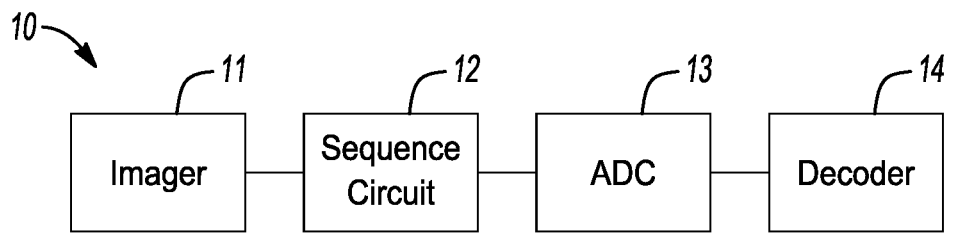
FIG. 1 is a diagram depicting an example imaging system.

FIG. 1 depicts an example imaging system 10. The imaging system 10 is comprised generally of an imager 11, a sequencing circuit 12, an analog-to-digital converter (ADC) 13 and a decoder 14. The imager 11 is configured to capture an image of a scene, where the image is represented by pixel values arranged in a matrix. In some embodiments, the imager is further defined as a CCD sensor or CMOS sensor.

Pixel values for the image are then quantized by the imaging system 10. The sequencing circuit 12 is configured to receive the pixel values for image from the imager 11 and operates to segment and/or sequence the pixel values of the matrix into columns, rows, or patches as will be further described below. The analog-to-digital converter 13 is interfaced with the sequencing circuit 12 and quantizes the pixel values, for example using sigma delta modulation. In one embodiment, the quantized pixel values are assembled into a rectangular array and the array is stored as a final image in a non-transitory computer-readable memory. In other embodiments, the quantized pixel values are optionally reconstructed before being stored in the non-transitory computer-readable memory. In this case, the decoder 14 is interfaced with the analog-to-digital converter 13 and reconstructs a final image from the quantized pixel values. It is envisioned that other types of signal processing, such as JPEG compression, contrast adjustment, etc., may be applied to the quantized pixel values as well.

In one example, the imaging system 10 is implemented as part of a camera. It is to be understood that only the relevant components of the imaging system 10 are discussed in relation to FIG. 1, but that other components may be needed to control and manage the overall operation of the system.

By way of background, the existing quantization schemes are first introduced in the context of image quantization. Let $X \in \mathbb{R}^{N,N}$ store the pixel values of a grayscale image. Without any ambiguity, the image is referred to as matrix X.

For Memoryless Scalar Quantization (MSQ), suppose the alphabet $\mathcal{A} = \mathcal{A}_\delta$ is defined as in (1.1), the scalar quantization, $Q_\mathcal{A}: \mathbb{R} \to \mathcal{A}$ quantizes a given scalar by rounding it off to the nearest element in the alphabet $$Q_\mathcal{A}(z) \in \operatorname*{argmin}_{v \in \mathcal{A}} |v - z|$$

The Memoryless Scalar Quantization (MSQ) applies scalar quantization to each sample of the input sequence independently. In terms of image quantization, for a given image X, MSQ on X means quantizing each pixel independently
$$\mathcal{A}^{N,N} \ni q = Q_\mathcal{A}^{MSQ}(X), \text{with} \, q_{i,j} = Q_\mathcal{A}(X_{i,j}).$$

Here $q_{i,j}$ and $X_{i,j}$ are the (i,j)th entry of the quantized and the original images q and X, respectively.

Sigma delta quantization is an adaptive quantization scheme proven to be more efficient than MSQ in a variety of applications. The adaptiveness comes from the fact that it utilizes quantization errors of previous samples to increase the accuracy of the current sample. Suppose the sample sequence is $y=(y_1, \ldots, y_m)$, the first order $\Sigma\Delta$ quantization $q = Q_\mathcal{A}^{\Sigma\Delta,1}(y)$ is obtained by running the following iterations $$\begin{aligned} q_i &= Q_\mathcal{A}(y_i + u_{i-1}), \\ (Du)_i &:= u_i - u_{i-1} = y_i - q_i. \end{aligned} \quad (1.2)$$

One can see from the first equation that one quantizes the $i^{th}$ input $y_i$ by first adding to it the historical errors stored in the so-called state variable $u_{i-1}$ then applying the scalar quantizaiton to the sum. In the second equation, the D is the forward finite difference operator/matrix, with 1 s on the diagonal and −1 s on the sub-diagonal. Hence, the second equation defines a recurrence relation allowing one to update the state variable $u_i$. The scheme defined in equation (1.2) is the so-called first order quantization scheme because it only uses one step of the historical error, $u_{i-1}$. More generally, one can define the $r^{th}$ order $\Sigma\Delta$ quantization denoted by $q = Q_\mathcal{A}^{\Sigma\Delta,r}(y)$ by involving r steps of historical errors, $u_{i-1}, u_{i-1}, u_{i-2}, \ldots, u_{i-r}$. More precisely, each entry $q_i$ of q is obtained by $$\begin{aligned} q_i &= Q_\mathcal{A}(\rho_r(u_{i-1}, \ldots u_{i-r}) + y_i), \\ (D^r u)_i &:= y_i - q_i, \end{aligned}$$

where $\rho_r$ is some general function aggregating the accumulated errors $u_{i-1}, \ldots, u_{i-r}$. The $r^{th}$ order finite difference operator is defined via $D^r u := D(D^{r-1} u)$.

The main advantage of Sigma Delta quantization over MSQ is its adaptive usage of the feedback information. The feedback information helps the quantizer to efficiently use the given bits to maximally store information from special types of signals, such as those with low frequencies. Mathematically, these adaptive quantizers achieve high information conversion rate through the noise-shaping effect on the quantization error, which means the errors of such quantizers are distributed non-uniformly. When inputting the same random sequence, the error spectrum of MSQ is uniform, while that of Sigma Delta quantization is (nearly) linear. This property has the following theoretically explanation. First, the matrix form of definition (1.2) gives an expression of the first order Sigma Delta quantization error y−q $$y-q=Du, \|u\|_\infty \leq \delta/2,$$

where $\delta$ is the quantization step-size in (1.1) and D is the finite difference matrix. This is saying that y−q∈D($B_{\|\cdot\|_\infty}$($\delta$/2)): the quantization error y−q lies in the $\ell_\infty$ ball of radius $\delta$/2 reshaped by the operator D. In case of the $r^{th}$ order $\Sigma\Delta$ quantization (r∈ $\mathbb{Z}_+$), one would similarly have $$y-q=D^r u, \|u\|_\infty \leq \delta/2,$$

which means the quantization error y−q lies in the $\ell_\infty$ ball reshaped by the operator $D^r$.

The singular values of $D^r$ determine the radii of the reshaped $\ell_\infty$ ball containing quantization errors. The singular vectors of D lie almost aligned with the Fourier basis, and the singular values of D increases with frequencies. Therefore, the low-frequency errors corresponding to smaller singular values of $D^r$ would be compressed most. One can numerically verify this unbalanced error reduction effect of $D^r$ on various sinusoidal frequencies by computing the ratio $$\rho_r(w) = \frac{\|D^r e^{-iwt}\|_2}{\|e^{-iwt}\|_2}$$

Figure 2:
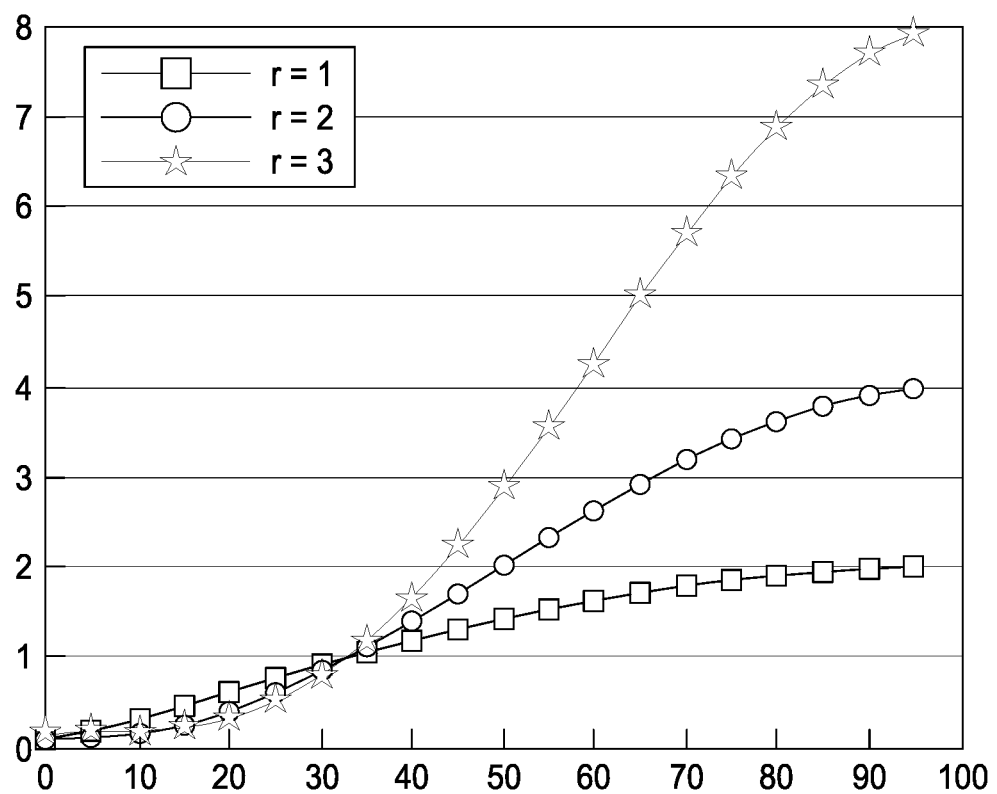
FIG. 2 is a graph showing compression rate of D, $D^2$ and $D^3$ n exponential functions with various frequencies.

From the plot of $\rho_r(w)$ in FIG. 2, one can see that the low frequency sinusoids lose more energy after going through $D^r$ especially when the quantization order r is large.

Since Sigma Delta quantization can keep most error away from the low frequency, it is ideal for quantizing low-frequency signals. For instance, dense time samples of audio signals can be deemed as low frequency vectors, and they have indeed been shown to be a good application of Sigma Delta quantization. Images, on the other hand, do not consist of only low frequencies, as sharp edges have pretty slowly decaying Fourier coefficients. Therefore, it is not obvious whether applying Sigma Delta quantization to images is beneficial.

Despite the importance of quantization in image acquisition, MSQ is still the state-of-the-art quantizer in commercial cameras. The major drawback of MSQ is that when the bit-depth (i.e., the number of bits used to represent each pixel) is small, it has a color-banding artifact, i.e., different colors merge together to cause fake contours and plateaus in the quantized image. A known technique called dithering reduces color-banding by randomly perturbing the pixel values (e.g., adding random noise) before quantization. It then breaks artificial contour patterns into the less harmful random noise. However, this random noise is still quite visible and a more fundamental issue is that dithering only randomizes the quantization error instead of reducing it. The same amount of errors still exist in the quantized image and will manifest themselves in other ways.

Another method to avoid color-banding is digital halftoning, first proposed in the context of binary printing, where pixel values are converted to 0 or 1 for printing leading to a possibly severe color-banding artifact. To mitigate it, the digital half-toning was proposed based on the ideas of sequential pixel quantization and error diffusion. Error diffusion means the quantization error of the current pixel will spread out to its neighbours to compensate for the overall under/over-shooting. The decay of energy during spreading is set to empirical values that minimizes the overall $\ell_2$ quantization error of an entire image class. Error diffusion works under a similar assumption as the Sigma Delta quantization that the image intensity is varying slowly and smoothly. In a sense, it trades color-richness with spatial resolution. As dithering, error fusion does not reduce the overall noise but only redistributes it.

From this discussion, one sees that both dithering and digital halftoning are only redistributing the quantization error instead of compressing it. In contrast, this disclosure introduces an improved technique for quantizing pixels of an image. Explicitly, suppose $N^2$ is the total number of pixels and s is the number of pixels representing curve discontinuity (e.g., edges) in the image, the proposed technique reduces the quantization error from O(N) to O($\sqrt{s}$). This is achieved by combining Sigma Delta quantization with an optimization based reconstruction. It was observed in the numerical experiment that both the low and high frequency errors are reduced.

FIG. 3 illustrates one embodiment for quantizing pixels of an image in accordance wih this disclosure. As a starting point, an image of a scene is captured at 31 by an imager or imaging device. The image is represented by pixel values arranged in a matrix.

When using a $r^{th}$ order Sigma Delta quantization scheme on a 2D image X, pixel values of the image X need to be converted into sequences as indicated at 32. One way to do this is applying Sigma Delta quantization independently to each column of the image, $$q = Q_{\Sigma\Delta}^{\Sigma\Delta,r}(X), \quad q = [q_1, \ldots, q_N], \quad q_j = Q_{\Sigma\Delta}^{\Sigma\Delta,r}(X_j), \quad j = 1, \ldots, N.$$

where $X_j$ is the $j^{th}$ column of X. In other words, the pixel values for each column are quantized as a whole, thereby minimizing accumulated quantization error from a starting pixel value to the currently quantized pixel value in a given column of the image. In one example, the pixel values from the columns of the image are quantized in series (i.e., one column at a time) as shown in FIG. 4A. In another example, the pixel values from the columns of the image are quantized in parallel as shown in FIG. 4B. As opposed to column wise, it is readily understood that pixel values of the image could alternatively be quantized row wise. In other words, the pixel values from a subset of pixels are grouped together and then quantized, where the pixels in the subset of pixels are neighbors to each other in the matrix.

With continued reference to FIG. 3, the sequence of pixel values is then quantized at 33 using Sigma Delta modulation. In a first embodiment, 1D Sigma Delta quantization is applied to each column of the image. A key question one may ask is the practicality of the proposed adaptive quantizers on commercial cameras. A natural concern is the waiting time. Unlike MSQ that quantizes each pixel in parallel, Sigma Delta quantization can only be performed sequentially, which seems to inevitably introduce extra waiting time. However, this is not the case because current cameras are already using sequential quantization architectures for consistency, energy and size considerations. More specifically, in current cameras, to reduce the number of ADC (Analog to Digital Converters) and save energy, the whole image or a column of pixels are assigned to one ADC, which means these pixels need to wait in a queue to be quantized anyway. Thus, to implement the proposed technique, an additional memory unit is added to the circuit of a camera.

Quantized values of the image are assembled into a rectangular array at 35 and stored as a final image in a non-transitory computer-readable medium. In some embodiments, the quantized values of the image may optionally be decoded at 34 using a decoder. The decoder is configured to minmize an image norm (e.g., total variation norm) as will be further described below.

Although one can apply 1D ΣΔ quantization column by column to an image, it is likely to create discontinuities across columns. As images are two-dimensional arrays, a two-dimensional quantization scheme seems more helpful in maintaining continuity along both rows and columns. For a second embodiment, this disclosure proposes a 2D Sigma Delta quantization which can be applied to one or more patches of an image.

In a nutshell, the key property that defined the first order 1D Sigma Delta quantization map $Q_{\mathcal{A}}^{\Sigma\Delta,1}: \mathbb{R}^N \ni y \to q \in \mathcal{A}^N$ ($\mathcal{A}$ is the alphabet) is that there exists a vector $u \in \mathbb{R}^N$, the state variable, such that q and u obey (A1) (boundedness/stability): $\|u\|_\infty \leq C$, for some constant C;

(A2) (adaptivity): $u_i = u_{i-1} + y_i - q_i$, $\forall i$ where $u_i$, $y_i$, $q_i$ being the ith component of the vectors u, x and q, respectively;

(A3) (causality): q only depends on the history of x, that is $q_i = f(y_i, y_{i-1}, \ldots, y_1)$, for any i and some function $f$.

This scheme is extended to two dimensions as described below. The quantization map in 2D is defined as $Q_{\mathcal{A},2D}^{\Sigma\Delta}: \mathbb{R}^{N,N} \ni y \to q \in \mathcal{A}^{N,N}$, the auxiliary variable $u \in \mathbb{R}^{N,N}$ and the properties (A1)-(A3) can be changed to (A1'): $\|u\|_{max} \leq C$ ($\|\cdot\|_{max}$ denotes the entry-wise maximum of a matrix)

(A2'): $u_{i,j} = u_{i,j-1} + u_{i-1,j} - u_{i-1,j-1} + y_{i,j} - q_{i,j}$ which has a matrix representation $DuD^T = y - q$, and (A3'): $q_{i,j} = f(\{y_{i',j'}\}_{i' \leq i, j' \leq j})$.

Provided that the quantization alphabet is large enough, one can show that the u and q that satisfy (A1')-(A3') can be constructed through the recursive updates $$q_{i,j} = Q_{\mathcal{A}}(u_{i,j-1} + u_{i-1,j} - u_{i-1,j-1} + y_{i,j}), \quad (2.1)$$

$$u_{i,j} = u_{i,j-1} + u_{i-1,j} - u_{i-1,j-1} + y_{i,j} - q_{i,j}.$$

Note that the first row and column are initialized exactly the same as the 1D $1^{st}$ order sigma delta quantization. With a 1-bit alphabet, there might not exist a pair of u and q obeying (A1)-(A3). With a two or more bit alphabet, the following proposition ensures the existence of a stable 2D Sigma Delta quantization.

Proposition 2.1—For a given 2D array $y \in [a, b]^{N,N}$ and bit depth $d \geq 2$, there exists an alphabet $\mathcal{A}$ such that u and q generated by (2.1) satisfies (A1')-(A3') with $$C = \frac{b-a}{2(2^d - 3)}.$$

Proof for this propositon is as follows. Without loss of generality, assume for all $1 \leq i,j \leq N$, $a \leq y_{i,j} \leq b$, with some constant $a \leq b$. Let $$C = \frac{b-a}{2(2^d - 3)},$$

create the alphabet as $$\mathcal{A} = \{a-2C, a, a+2C, \ldots, b, b+2C\}.$$

Then $$|\mathcal{A}| = \frac{b + 2C - (a - 2C)}{2C} + 1 = 2^d.$$

Next, use the second principle of induction to show that u generated by (2.1) satisfies $\|u\|_\infty \leq C$.

Induction hypothesis: if for all the pairs (m, n) such that $m \leq i$, $n \leq j$, $m+n < i+j$, $|u_{m,n}| \leq C$, then $|u_{i,j}| \leq C$.

Base case: $|u_{1,1}| = |y_{1,1} - q_{1,1}| = |y_{1,1} - Q_{\mathcal{A}}(y_{1,1})| \leq C$.

Induction step: if i=1, $q_{i,j} = Q_{\mathcal{A}}(y_{i,j} + u_{i,j-1})$, by induction hypothesis $a - C \leq y_{i,j} + u_{i,j-1} \leq b + C$, thus $|u_{i,j}| = |y_{i,j} + u_{i,j-1} - q_{i,j}| \leq C$. The same reasoning follows when j=1.

If i,j≥2, by induction hypothesis $a - 3C \leq y_{i,j} + u_{i,j-1} + u_{i-1,j} - u_{i-1,j-1} \leq b + 3C$, we also have $|u_{i,j}| = |y_{i,j} + u_{i,j-1} + u_{i-1,j} - u_{i-1,j-1} - q_{i,j}| \leq C$.

Next, we show that the stability constant $$C = \frac{b-a}{2(2^d - 3)},$$

corresponding to the uniform alphabet $$A = \{a-2C, a, a+2C, \ldots, b, b+2C\}$$

used in the above proposition is optimal. Thus, it has been shown that for each patch of pixels comprising an image, pixel values of a given patch can be quantized using a two dimensional generalization of sigme delta modulation.

Different techniques for sequencing pixels for two dimensional sigma delta quantization are contemplated by this disclosure. One example for sequencing pixels is illustrated in FIG. 5. In this example, a sequence of pixel values is created by sequencing pixel values along antidiagonal of the matrix starting from an upper left corner of the given patch and moving to the lower right corner of the given patch. Within each antidiagonal, the sequence may go from lower left to upper right as seen in FIG. 5. That is, the sequence of pixel values is P11, P21, P12, P31, P22, P13, P32, P23 and P33. Alternatively, within each antidiagonal, the sequence may go from upper right to lower left. That is, the sequence of pixel values is P11, P12, P21, P13, P22, P31, P23, P32 and P33. In either case, the sequence of pixels may be quantized in series by an ADC as seen in FIG. 5. In other embodiments, pixels along each antidiagonal can be quantized in parallel. It is also envisioned that pixels may be sequenced and quantized along diagonals of the matrix as well. These seqeuncing techniques are applied to each patch from the image.

Proposition 2.2—For fixed bit depth $d \geq 2$, the alphabet $\mathcal{A}$ for 2D ΣΔ quantization given in Proposition 2.1 is optimal, in the sense that let $\tilde{C}$ be the stability constant of any other d-bit alphabet $\tilde{A}$ (not necessarily equal-spaced), then it is necessary that $\tilde{C} \leq C$. To prove by contradiction, assume there exists a d-bit alphabet $\tilde{A}$ whose stability constant is smaller, i.e., $\tilde{C}<C$. Let the alphabet $\tilde{A}$ be $c_1<c_2<\ldots<c_n$, with $N=2^d$. Assume $c_1<\ldots<c_i\leq a\leq c_{i+1}<\ldots<c_j\leq b<c_{j+1}<\ldots<C_N$, note that there is no restriction on the range of alphabet, that is, it is possible that $a\leq c_1$ or $b\geq c_N$. Also, denote the largest interval length in the alphabet within [a, b] as $2\tilde{I}=\max\{2I, b-c_j\}$ and $2I=\max\{c_{i+2}-c_{i+1},\ldots,c_j-c_{j-1}\}$. The case $d\geq 3$ is easier than $d=2$, so first prove the case $d\geq 3$.

For $d\geq 3$, start by proving that there are at least two elements in the alphabet that are within [a, b] so I is well defined. Notice that $$C = \frac{b-a}{2(2^d-3)} < \frac{b-a}{10},$$

if there is zero or only one $c_\ell$ between a, b, i.e., $a\geq c_\ell \geq b$, then one can choose $a\leq y_{1,1}\leq b$ properly such that $$|y_{1,1} - Q_A(y_{1,1})| \geq \frac{b-a}{4} > C > \tilde{C},$$

which leads to a contradiction.

Next, consider the following cases. In this first case, $a\leq c_1$ or $b\geq c_N$. Under this assumption one of the following two cases must hold: 1) $a\leq c_1$ and $c_1-a\geq b-c_N$ or 2) $b-c_N>c_1-a$. A closer look indicates that these two cases are exactly the same upon exchanging the roles of a and b hence they share the same proof. Without loss of generality, assume case 1 hold: $a\leq c_1$ and $c_1-a\geq b-c_N$. Next, specify the following sub-cases:

(a) $c_N\leq b$, let $[c_\ell, c_{\ell+1}]$ be the largest interval in $\tilde{A}$ for some $\ell$, i.e., $c_{\ell+1}-c_\ell = 2I$. Choose $$y_{1,1} = \frac{c_\ell + c_{\ell+1}}{2} - \epsilon, y_{1,2} = y_{2,1} = c_\ell + 2\epsilon$$

with small enough $\in$ such as $10^{-10}$ $(C-\tilde{C})$ and $y_{2,2}=a$, this leads to $u_{1,1}=I-\epsilon$, $u_{1,2}=u_{2,1}=-I+\epsilon$, then $q_{2,2}=Q_A(y_{2,2}+u_{1,2}+u_{2,1}-u_{1,1})=Q_A(a-3I+3\epsilon)$, the quantization error $$|u_{2,2}| = |y_{2,2} + u_{1,2} + u_{2,1} - u_{1,1} - q_{2,2}| =$$
$$|Q_A(a-3I+3\epsilon) - (a-3I+3\epsilon)| = c_1 - a + 3I - 3\epsilon \geq$$
$$c_1 - a + \frac{3}{2}\cdot\frac{c_N - c_1}{2^d - 1} - 3\epsilon \geq c_1 - a + \frac{3}{2}\cdot\frac{b-a-2(c_1-a)}{2^d-1} - 3\epsilon \geq$$
$$\frac{3(b-a)}{2(2^d-1)} - 3\epsilon \geq \frac{b-a}{2(2^d-3)} - 3\epsilon = C - 3\epsilon > \tilde{C}.$$

The second inequality used the assumption $c_1-a\geq b-c_N$, the third one used $c_1-a\geq 0$ and $d\geq 3$. Then this contradicts the assumption $\|u\|_{max}\leq \tilde{C}$.

(b) $c_N>b$ and $c_{j+1}-c_j<3(b-c_j)$. If $2\tilde{I}=\max\{2I, b-c_j\}=b-c_j$, let $$y_{1,1} = c_j + \tilde{I} - \epsilon, y_{1,2} = y_{2,1} = \frac{c_{j+1}+c_j}{2} - \tilde{I} + 2\epsilon \leq b$$

with sufficiently small $\epsilon$ as in (a) and $y_{2,2}=a$, then $$u_{1,1} = \tilde{I} - \epsilon, u_{1,2} = u_{2,1} = -\frac{c_{j+1}-c_j}{2} + \epsilon < -\tilde{I} + \epsilon.$$

If $2\tilde{I}=2I$, one can choose $y_{1,1}, y_{1,2}, y_{2,1}$ as in (a) such that $u_{1,1}=\tilde{I}-\epsilon$, $u_{1,2}=u_{2,1}=-\tilde{I}+\epsilon$. In both cases, let $y_{2,2}=a$, have $y_{2,2}+u_{1,2}u_{2,1}-u_{1,1}\leq a-3\tilde{I}+3\epsilon<c_1$, $q_{2,2}=Q_A(y_{2,2}+u_{1,2}+u_{2,1}-u_{1,1})=c_1$, the quantization error at $q_{2,2}$ is $$|u_{2,2}| = |c_1 - (y_{2,2} + u_{1,2} + u_{2,1} - u_{1,1})|$$
$$\geq c_1 - a + 3\tilde{I} - 3\epsilon$$
$$\geq c_1 - a + \frac{3}{2}\cdot\frac{b-c_1}{2^d-1} - 3\epsilon$$
$$\geq c_1 - a + \frac{3}{2}\cdot\frac{b-a-(c_1-a)}{2^d-1} - 3\epsilon$$
$$\geq \frac{3(b-a)}{2(2^d-1)} - 3\epsilon$$
$$\geq \frac{b-a}{2(2^d-3)} - 3\epsilon$$
$$= C - 3\epsilon > \tilde{C}.$$

This leads to a contradiction.

(c) $c_N>b$ and $c_{j+1}-c_j\geq 3(b-c_j)$. If one choose $$y_{1,1} = \frac{b+c_j}{2} - \epsilon$$

with some small $\in$ and $y_{1,2}=b$, then $$u_{1,1} = \frac{b-c_j}{2} - \epsilon, u_{1,2} = \frac{3}{2}(b-c_j) - \epsilon \leq \tilde{C}.$$

Since it holds for arbitrary small $\in$, it must have $b-c_j\leq 2/3\tilde{C}$. This gives $b-2/3\tilde{C}\leq c_j\leq b$ and $$2I \geq \frac{c_j - c_1}{j-1} \geq \frac{b - \frac{2}{3}\tilde{C} - c_1}{2^d - 2},$$

where the last inequality is due to the assumption $c_N>b$ so that $j\leq N-1$. Same as in (a), one can choose $y_{1,1}, y_{1,2}, y_{2,1}$ properly and $y_{2,2}=a$, such that $u_{1,1}=I-\epsilon$, $u_{1,2}=u_{2,1}=-I+\in$, provided that $\epsilon$ is small enough. Then the quantization error at $q_{2,2}=Q(a-3I+3\in)=c_1$ is $$|u_{2,2}| = |Q_A(a-3I+3\epsilon) - (a-3I+3\epsilon)|$$
$$= c_1 - a + 3I - 3\epsilon$$
$$\geq c_1 - a + \frac{3}{2}\cdot\frac{b-\frac{2}{3}\tilde{C}-c_1}{2^d-2} - 3\epsilon$$
$$\geq c_1 - a + \frac{3}{2}\cdot\frac{b-a-\frac{b-a}{3(2^d-3)}-(c_1-a)}{2^d-2} - 3\epsilon$$
$$\geq \frac{3}{2}\cdot\frac{b-a-\frac{b-a}{3(2^d-3)}}{2^d-2} - 3\epsilon$$

$$\geq \frac{b-a}{2(2^d-3)} - 3\epsilon$$

$$= C - 3\epsilon > \tilde{C}.$$

This also leads to a contradiction.

In the next case, $a > c_1$ and $b < c_N$. If $a > c_2$ and $b < c_{N-1}$, then one can easily choose a proper $a \leq y_{1,1} \leq b$ with quantization error at least $$\max\{2I, c_{i+1} - a, b - c_j\} \geq \frac{b-a}{2(2^d - 4 + 1)} = C > \tilde{C},$$

which leads to contradiction. Therefore, without loss of generality, assume $c_1 < a \leq c_2$ and $c_{2-a} \geq b - c_{N-1}$, similar as above, specify the following sub-cases:

(d) $c_{N-1} \leq b$. For arbitrary constant $a - 3I < \xi < c_2$, one can choose $y_{1,1}, y_{1,2}, y_{2,1}, y_{2,2}$ properly such that $\xi = y_{2,2} + u_{1,2} + u_{2,1} - u_{1,1}$. If $a \leq \xi < c_2$, set $y_{1,1} = y_{1,2} y_{2,1} = c_2$, $y_{2,2} = \xi$, then $u_{1,1} = u_{1,2} = u_{2,1} = 0$, $y_{2,2} + u_{1,2} + u_{2,1} - u_{1,1} \xi$. If $a - 3I < \xi < a$, denote $$w = \frac{a - \xi}{3},$$

then $0 < w < I$. Let $[c_\ell, c_{\ell+1}]$ be the largest interval in $\tilde{A}$ for some $\ell$, i.e., $c_{\ell+1} - c_\ell = 2I$. Choose $y_{1,1} = c_\ell + w, y_{1,2} = y_{2,1} = c_{\ell+1} - 2w$, $y_{2,2} = a$, then $u_{1,1} = w$, $u_{1,2} = u_{2,1} = w$, one has $y_{2,2} + u_{1,2} + u_{2,1} - u_{1,1} = a - 3w = \xi$. Hence whatever $c_1$ is, we can always obtain the quantization error $$\max_{a-3I < \xi < c_2} |\xi - Q_A(\xi)| \geq \frac{1}{3}(c_2 - (a - 3I))$$

$$= \frac{1}{3}(c_2 - a) + I$$

$$\geq \frac{1}{3}(c_2 - a) + \frac{1}{2} \cdot \frac{c_{N-1} - c_2}{2^d - 3}$$

$$\geq \frac{1}{3}(c_2 - a) + \frac{1}{2} \cdot \frac{b - a - 2(c_2 - a)}{2^d - 3}$$

$$\geq \frac{b-a}{2(2^d-3)} + \left(\frac{1}{3} - \frac{1}{2^d - 3}\right)(c_2 - a)$$

$$\geq \frac{b-a}{2(2^d-3)}$$

$$= C > \tilde{C}.$$

This leads to a contradiction.

(e) $c_{N-1} > b$ and $c_{j+1} - c_j > \frac{3}{2}(b - c_j)$. Similar as in (d), first show that one can choose between $y_{1,1}, y_{1,2}, y_{2,1}, y_{2,2}$ properly to make $y_{2,2} + u_{1,2} + u_{2,1} - u_{1,1}$ arbitrary constant between $a - 3\tilde{I}$ and $c_2$. If $2\tilde{I} = 2I$, it follows the same reasoning as in (d), here we discuss the case when $2\tilde{I} = b - c_j$. If $a \leq \xi < c_2$, let $y_{1,1} = y_{1,2} = y_{2,1} = c_j$, $y_{2,2} = \xi$, then $y_{2,2} + u_{1,2} + u_{2,1} - u_{1,1} = \xi$. If $a - 3\tilde{I} < \xi < a$, denote $w = a - \xi$, then $0 < w < 3\tilde{I}$, we specify the following sub-cases: i) if $0 < w \leq \tilde{I}$, let $y_{1,1} = c_j + w, y_{1,2} = y_{2,1} = c_j - w$, $y_{2,2} = a$, then $u_{1,1} = w$, $u_{1,2} = u_{2,1} = 0$, $y_{2,2} + u_{1,2} u_{2,1} - u_{1,1} = a - w = \xi$; ii) if $\tilde{I} < w \leq 2\tilde{I}$, let $y_{1,1} = c_j + w - \tilde{I}, y_{1,2} = c_{j+1} - w$, $y_{2,1} = c_j - (w - \tilde{I})$ and $y_{2,2} = a$, then $u_{1,1} = w - \tilde{I}, u_{1,2} = -\tilde{I}, u_{2,1} = 0$, $y_{2,2} + u_{1,2} + u_{2,1} - u_{1,1} = a - w = \xi$, iii) if $2\tilde{I} < w < 3\tilde{I}$, let $y_{1,1} = c_j + w - 2\tilde{I}$, $y_{1,2} = y_{2,1} = c_{j+1} - w + \tilde{I}$ and $y_{2,2} = a$, then $u_{1,1} = w - 2\tilde{I}$, $u_{1,2} = u_{2,1} = -\tilde{I}, y_{2,2} + u_{1,2} + u_{2,1} - u_{1,1} = a - w = \xi$.

Therefore, whatever $c_1$ is, the worst case quantization error can reach $$\max_{a-3\tilde{I} < \xi < c_2} |\xi - Q_A(\xi)| = \frac{1}{3}(c_2 - (a - 3\tilde{I}))$$

$$= \frac{1}{3}(c_2 - a) + \tilde{I}$$

$$\geq \frac{1}{3}(c_2 - a) + \frac{1}{2} \cdot \frac{b - c_2}{2^d - 3}$$

$$\geq \frac{1}{3}(c_2 - a) + \frac{1}{2} \cdot \frac{b - a - (c_2 - a)}{2^d - 3}$$

$$\geq \frac{b-a}{2(2^d-3)} + \left(\frac{1}{3} - \frac{1}{2(2^d-3)}\right)(c_2 - a)$$

$$\geq \frac{b-a}{2(2^d-3)}$$

$$= C > \tilde{C}.$$

This leads to a contradiction.

(f) $c_{N-1} > b$ and $c_{j+1} - c_j > \frac{3}{2}(b - c_j)$, similar as (c), one has $j \leq N - 2$ and $b - c_j \leq \frac{4}{3}\tilde{C}$, then $$\max_{a-3\tilde{I} < \xi < c_2} |\xi - Q_A(\xi)| = \frac{1}{3}(c_2 - (a - 3I))$$

$$= \frac{1}{3}(c_2 - a) + I$$

$$\geq \frac{1}{3}(c_2 - a) + \frac{1}{2} \cdot \frac{b - \frac{4}{3}\tilde{C} - c_2}{2^d - 4}$$

$$\geq \frac{1}{3}(c_2 - a) + \frac{1}{2} \cdot \frac{b - a - \frac{2(b-a)}{3(2^d-3)} - (c_2 - a)}{2^d - 4}$$

$$\geq \frac{b-a}{2(2^d-3)} + \left(\frac{1}{3} - \frac{1}{2(2^d-4)}\right)(c_2 - a)$$

$$\geq \frac{b-a}{2(2^d-3)}$$

$$= C > \tilde{C}.$$

There also leads to a contradiction.

For the case $d = 2$, there are only 4 elements in the alphabet $\tilde{A} = \{c_1, c_2, c_3, c_4\}$ with $c_1 < c_2 < c_3 < c_4$. Consider the case $a \leq c_1$ or $b \geq c_4$, if there are at least two elements in $\tilde{A}$ that are within $[a, b]$, the proof follows the same reasoning as $d \geq 3$, which has been discussed in (a)-(c). Here we discuss the case that $a \leq c_1$ and there is only one element in the $\tilde{A}$ that is within $[a, b]$, i.e., $a \leq c_1 \leq b < c_2 < c_3 < c_4$. In this case, let $$y_{1,1} = \frac{c_1 + b}{2}, y_{1,2} = y_{2,1} = y_{2,2} = a,$$

then $u_{1,1} = \frac{b - c_1}{2}, u_{1,2} = u_{2,1} = a - c_1,$ $$u_{2,2} = a + 2(a - c_1) - \frac{b - c_1}{2} - Q_A\left(a + 2(a - c_1) - \frac{b - c_1}{2}\right) =$$

$$2(a - c_1) - \frac{b - c_1}{2} \leq \frac{a - c_1}{2} - \frac{b - c_1}{2} = -C$$

hence $|u_{2,2}| \geq \frac{b-a}{2} = C > \tilde{C},$ which leads to a contradiction.

Next, the two remaining cases are discussed when both $a > c_1$ and $b < c_4$ hold: $c_1 < a \leq c_2 \leq b < c_3 < c_4$ and $c_1 < a \leq c_2 < c_3 \leq b < c_4$, which corresponds to two cases that there are 1 or 2 elements in the alphabet between a and b, respectively.

For $c_1 < a \leq c_2 < c_3 \leq b < c_4$, without loss of generality, assume $c_2 + c_3 \geq b + a$. Note that one must have $c_2 - c_1 < b - a$ since $$\tilde{C} < C = \frac{b-a}{2},$$

combining these two inequalities get $c_1 + c_3 > 2a$, then $a < \frac{1}{2}(c_1+c_3) < b$. Choose some small $\epsilon$ and the first $3 \times 3$ entries of y as $$y = \begin{pmatrix} \frac{1}{2}(c_3+c_2)-\epsilon & c_2 & c_2+2\epsilon & \cdots \\ c_2 & c_2 & \frac{1}{2}(c_1+c_3) & \cdots \\ c_2+2\epsilon & \frac{1}{2}(c_1+c_3) & a & \cdots \\ \cdots & \cdots & \cdots & \cdots \end{pmatrix}.$$

Provided that $\epsilon$ is small enough, one can check that the first $3 \times 3$ entries in u are as follows $$u = \begin{pmatrix} \frac{1}{2}(c_3-c_2)-\epsilon & \frac{1}{2}(c_3-c_2)-\epsilon & -\frac{1}{2}(c_3-c_2)+\epsilon & \cdots \\ \frac{1}{2}(c_3-c_2)-\epsilon & \frac{1}{2}(c_3-c_2)-\epsilon & -\frac{1}{2}(c_2-c_1)+\epsilon & \cdots \\ -\frac{1}{2}(c_3-c_2)+\epsilon & -\frac{1}{2}(c_2-c_1)+\epsilon & a-\frac{1}{2}(c_3+c_2)+3\epsilon & \cdots \\ \cdots & \cdots & \cdots & \cdots \end{pmatrix}$$

By assumption, one has $c_2 + c_3 \geq b + a$, then for small enough $\epsilon$, $$|u_{3,3}| \geq \frac{b-a}{2} - 3\epsilon = C - 3\epsilon > \tilde{C},$$

this leads to a contradiction.

For $c_1 < a \leq c_2 < b \leq c_3 < c_4$, specify the following two cases:
(i)

$$c_2 \geq \frac{b+a}{2},$$

notice that $c_2 - c_1 < b - a$, so $c_1 + c_2 > 2a$, one can choose $y_{1,1} = c_2$, $y_{1,2} = y_{2,1} = \frac{1}{2}(c_1+c_2) + \epsilon$ for sufficiently small $\epsilon$ and $y_{2,2} = a$, then $u_{1,1} = 0$, $u_{1,2} = u_{2,1} = -\frac{1}{2}(c_2-c_1) + \epsilon$ and $Q_A(y_{2,2} + u_{1,2} + u_{2,1} - u_{1,1}) = Q_A(a - (c_2 - c_1) + 2\epsilon) = c_1$ and $$|y_{2,2} + u_{1,2} + u_{2,1} - u_{1,1} - Q_A(y_{2,2} + u_{1,2} + u_{2,1} - u_{1,1})| =$$

$$c_2 - a - 2\epsilon \geq \frac{b-a}{2} - 2\epsilon > \tilde{C},$$

which leads to a contradiction.

(ii)

$$c_2 < \frac{b+a}{2},$$

also notice that $c_3 - c_2 < b - a$, then one can choose y as follows with some small $\epsilon$, $$y = \begin{pmatrix} \frac{1}{2}(b+c_2)-\epsilon & c_2 & c_2+\frac{1}{2}(c_3-b)+2\epsilon & \cdots \\ c_2 & c_2 & \frac{1}{2}(c_1+c_3) & \cdots \\ c_2+\frac{1}{2}(c_3-b)+2\epsilon & \frac{1}{2}(c_1+c_3) & a & \cdots \\ \cdots & \cdots & \cdots & \cdots \end{pmatrix}$$

Provided that $\epsilon$ is small enough, the corresponding u is $$U = \begin{pmatrix} \frac{1}{2}(b-c_2)-\epsilon & \frac{1}{2}(b-c_2)-\epsilon & -\frac{1}{2}(c_3-c_2)+\epsilon & \cdots \\ \frac{1}{2}(b-c_2)-\epsilon & \frac{1}{2}(b-c_2)-\epsilon & -\frac{1}{2}(c_2-c_1)+\epsilon & \cdots \\ -\frac{1}{2}(c_3-c_2)+\epsilon & -\frac{1}{2}(c_2-c_1)+\epsilon & -\frac{c_2+b}{2}+a+3\epsilon & \cdots \\ \cdots & \cdots & \cdots & \cdots \end{pmatrix}$$

Since $c_2 \geq a$, then $$|u_{3,3}| = \frac{c_2+b}{2} - a - 3\epsilon \geq \frac{b-a}{2} - 3\epsilon > \tilde{C},$$

which leads to a contradiction.

The quanitzation time of 2D scheme (2.1) is O(N). Because for a fixed $t \in \{2,3,\ldots,2N\}$, all $u_{i,j}$ with $i+j=t$ (the points on an anti-diagonal) can be computed in parallel. The matrix representation of (2.1) is $y - q = DuD^T$.

It is easy to extend the first order quantization to high orders. If $r \geq 1$, the r-th order quantization obey the matrix form recursive formula $y - q = D^r u (D^r)^T$.

Throughout, it has been assumed that the image X to be quantized and reconstructed is a N×N matrix (the derivation for rectangle matrices are similar), $X = (\underline{x}_1, \underline{x}_2, \ldots, \underline{x}_N) = (\overline{x}_1, \overline{x}_2, \ldots, \overline{x}_N)^T$ is the column-wise and row-wise decomposition of X, D is the N×N difference matrix with 1 s on the diagonal and $-1$ s on the sub-diagonal and $D_1$ is the circulant difference matrix with an extra $-1$ on the upper right corner. Denote $\|\cdot\|_1$ as the entry-wise $\ell_1$-norm, and $\|\cdot\|_\infty$ refers to the entry-wise $\ell_\infty$-norm. Also, $\mathcal{F}_k$ denotes the discrete Fourier transform operator with frequency k, F is the N×N DFT matrix. Let $F_L$ contain rows of F with frequencies within $\{L, -L+1, \ldots, L\}$, and $P_L = F_L^* F_L$.

A general assumption is that the images satisfy some sparsity property in its gradients. To be more precise, consider three classes of images each satisfy one of the following three assumptions.

Assumption 2.1 ($\beta^{th}$ order sparsity condition) Suppose $X \in \mathbb{R}^{N,N}$ is an image, the columns or rows of X are piece-wise constant or piece-wise linear. Explicitly, the cardinality of $1^{st}$ order or $2^{nd}$ order differences in each column or row is smaller than the number of pixels: for $\beta=1$ or 2, fix s<N, $$\|(D^\beta)^T \underline{x}_j\|_0 \leq s, \forall j=1,2,\ldots,N, \text{ or } \|\overline{x}_j^T D^\beta\|_0 \leq s, \forall j=1,2,\ldots,N.$$

If $\beta=1$, the columns or rows of image X is piece-wise constant, if $\beta=2$, they are piece-wise linear.

Assumption 2.2—Both columns and rows in X are piece-wise constant or piece-wise linear. Explicitly, for $\beta=1$ or 2, fix $s<2N^2$, $$\|(D^\beta)^T X\|_0 + \|X D^\beta\|_0 \leq s.$$

Assumption 2.3–($\beta^{th}$ order minimum separation condition) X satisfies Assumption 2.1. In addition, the $\beta^{th}$ order differences of X in each column or row satisfy the $\Lambda_m$-minimum separation condition defined below for some small constant M<<N. Explicitly, this means for $\beta=1$ or 2, $\{D_1^\beta \underline{x}_i\}_{i=1,2,\ldots,N}$ or $\{\overline{x}_j^T (D_1^\beta)^T\}_{j=1,2,\ldots,N}$ satisfy $\Lambda_M$-minimum separation condition, note that here $D_1$ is the circulant difference matrix.

Definition 2.1 ($\Lambda_M$-minimum)—For a vector $x \in \mathbb{R}^N$, let $S \subset \{1,2,\ldots,N\}$ be its support set, say that it satisfies $\Lambda_M$-minimum separation condition if $$\min_{s,s' \in T, s \neq s'} \frac{1}{N}|s-s'| \geq \frac{2}{M}, \quad (2.2)$$

where $|\cdot|$ is the wrap-around distance. Use the definition $C(T, \Lambda_M)$ as the space of trigonometric polynomials of degree M on set T, i.e., $$C(T, \Lambda_M) = \{f \in C^\infty(T) : f(x) = \Sigma_{k=-M}^M a_k e^{i2\pi k x}\}.$$

The proposed decoders and their error bounds.

Let Q be encoder $Q_{col}$ or $Q_{2D}$ which will be specified in each case, and X be the image. The proposed decoders for images satisfying different assumptions can be unified in the following framework $$\hat{X} = \arg\min_Z f(Z, \beta) \text{ st. } \rho(Z, r) \leq c. \quad (2.3)$$

Here $\beta$ is 1 or 2 depending on whether the image is assumed to be piece-wise constant or piece-wise linear, $f(Z,\beta)$ is some loss function that encourages sparsity in the gradient under various assumptions, r is the order of Sigma Delta quantization, and $\rho(Z,r) \leq c$ is the feasibility constraint determined by the quantization scheme. Under this framework, let $\hat{X}$ be a solution of (2.3), one can obtain reconstruction error bounds of the following type $$\|\hat{X} - X\|_F \leq C(\beta, r, N, \delta), \quad (2.4)$$

where N is the size of the image, and $\delta$ is the alphabet step-size.

Now specify the explicit form of the optimization framework and error bound for each class of images.

Class 1: X satisfies Assumption 2.1 with order $\beta=1$ or 2 and sparsity s, the encoder is $r^{th}$ order ($r \geq \beta$) $Q_{col}$ with an alphabet step-size $\delta$, use the following optimization for reconstruction with $$\hat{X} = \arg\min_Z \|(D^\beta)^T Z\|_1 \text{ st. } \|D^{-r}(Z - Q_{col}(X))\|_\infty \leq \delta/2. \quad (2.5)$$

Theorem 3.1 shows that the reconstruction error is $$\|\hat{X} - X\|_F \leq C\sqrt{sN}\delta.$$

Class 2: X satisfies Assumption 2.2 with order $\beta=1$ and sparsity s, the encoder is $Q_{2D}$ with alphabet step-size $\delta$, use the following optimization $$\hat{X} \arg\min_Z \|D^T Z\|_1 + \|Z D\|_1 \text{ st. } \|D^{-1}(Z - Q_{2D}(X)) D^{-T}\|_\infty \leq \delta/2. \quad (2.6)$$

Theorem 3.3 shows that the reconstruction error is bounded by $$\|\hat{X} - X\|_F \leq C\sqrt{s}\delta.$$

Class 3: X satisfies Assumption 2.3 with order $\beta=1$ or 2 and sparsity s<<N, the encoder is $r^{th}$ order Sigma Delta quantization applied to each column: $Q_{col}$ with alphabet spacing $\delta$, $r \geq \beta$. Here we define a new alphabet $\tilde{A}$ with smaller step-size $$\tilde{\delta} := \frac{2\delta}{(2N)^r}$$

to quantize the last r entries in each column:

$$\tilde{A} := \{a, a+\tilde{\delta}, a+2\tilde{\delta}, \ldots, a+K\tilde{\delta}, b\}, K = \max\{j, a+j\tilde{\delta} < b\}.$$

The total number of boundary bits is of order $O(\log N)$, which is negligible comparing to the $O(N)$ bits needed for the interior pixels. Hence the following feasibility contraint holds:

$$\|D^{-r}(X - Q_{col}(X))_{N-r:N-1,:}\|_\infty \leq \left(\frac{1}{2N}\right)^r \delta.$$

Then we use the following optimization to obtain the reconstructed image $\tilde{X}$:

$$\tilde{X} = \arg\min_Z \|D_1^\beta Z\|_1 \quad (2.7)$$

$$\text{subject to} \begin{cases} \|D^{-r}(Z - Q_{col}(X))\|_\infty \leq \frac{\delta}{2}, \\ \|D^{-r}(Z - Q_{col}(X))_{N-r:N-1,:}\|_\infty \leq \left(\frac{1}{2N}\right)^r \delta. \end{cases}$$

Here $D^{-r}(Z - Q_{col}(X))_{N-r:N-1,:}$ refers to the last r rows of $D^{-r}(Z - Q_{col}(X))$. The error bound is $$\|\tilde{X} - X\|_F \leq C \frac{M^{r+\beta-2}}{N^{r-3}} \delta.$$

In MSQ, the quantization error for each pixel is $\delta/2$. Since the pixels are quantized independently, the total quantization error of the N×N image in Frobenius norm is $N\delta/2$. Similarly, when using $\Sigma\Delta$ quantizers ($Q_{col}$ or $Q_{2D}$) and decoding with the following naive decoder, $$\hat{X} = \text{Find Z st.} \|D^{-r}(Z - Q_{col}(X))\|_\infty \leq \delta/2,$$

the worse-case error is again $O(N\delta)$. This indicates that the TV norm penalty in the proposed decoders (2.5), (2.7) or (2.6) are playing a key role in reducing the error to $O(\sqrt{sN}\delta)$ and $O(\sqrt{s}\delta)$, respectively.

First, consider images with no minimum separation (Class 1), where the image X satisfies Assumption 2.1 and the encoder is $Q_{col}$ column by column quantization. With this encoder, the decoder (2.5) can be decoupled into columns, with the reconstructions done in parallel.

For each column $x \in \mathbb{R}^N$, let q be its $r^{th}$ order Sigma Delta quantization, i.e., $q = Q^{\Sigma\Delta,r}(x)$, $r \geq \beta, \beta=1,2$. Then the decoder (2.5) reduces to $$\hat{x} = \arg\min_z \|(D^\beta)^T z\|_1 \text{ subject to} \|D^{-r}(z-q)\|_\infty \leq \delta/2. \quad (3.1)$$

Here D is the finite difference matrix and δ is the quantization step-size. Therefore $(D^\beta)^T z$ represents the $1^{st}$ order or $2^{nd}$ order discrete derivatives in z. The $\ell_1$-norm is used to promote the sparsity of the derivatives corresponding to edges. The ball-constraint was a well known feasibility constraint for Sigma Delta quantization.

The following theorem provides the error bound of this decoder.

Theorem 3.1—For first order or second order Sigma Delta quantization, i.e., β=1 or 2, r≥β, assume the support of $(D^\beta)^T x$ has cardinality s, and $\hat{x}$ is a solution to (3.1), then $$\|\hat{x}-x\|_2 \leq C\sqrt{s}\delta. \tag{3.2}$$

Remark 3.2—The above error bound is for each column. Putting the error of all columns together as $\hat{X}$, one has $$\|\hat{X}-X\|_F \leq C\sqrt{sN}\delta.$$

Denote $h=(D^\beta)^T(\hat{x}-x)$, assume the support set of $(D^\beta)^T x$ is S with cardinality s, the complement set of S is $S^c$. Since $\hat{x}$ is a solution to (3.1), one has $$\|(D^\beta)^T x\|_1 \geq \|(D^\beta)^T x + h\|_1 \geq \|(D^\beta)^T x\|_1 - \|h_S\|_1 + \|h_{S^c}\|_1,$$

which gives $\|h_S\|_1 \geq \|h_{S^c}\|_1$, one can bound the $\ell_1$-norm of the misfit h as $$\|h\|_1 = \|h_S\|_1 + \|h_{S^c}\|_1 \leq 2\|h_S\|_1 \leq 2^{\beta+r+1}s\delta,$$

where the last inequality is due to $$\|h\|_\infty = \|(D^\beta)^T(\hat{x}-x)\|_\infty = \|(D^\beta)^T D^r D^{-r}(\hat{x}-x)\|_\infty \leq 2^{\beta+r}\delta.$$

Then the following properties hold $$\|(D^\beta)^T(\hat{x}-x)\|_1 \leq 2^{\beta+r+1}s\delta, \|D^{-\beta}(\hat{x}-x)\|_\infty = \|D^{r-\beta}D^{-r}(\hat{x}-x)\|_\infty \leq 2^{r-\beta}\delta.$$

Note that the inequalities above are bounded in $\ell_1$-norm and $\ell_\infty$ norm, which are dual to each other, one can therefore bound the reconstruction error $\|\hat{x}-x\|_2$ using $$\langle \hat{x}-x, \hat{x}-x \rangle = \langle (D^\beta)^T(\hat{x}-x), D^{-\beta}(\hat{x}-x) \rangle \leq 2^{2r+1}s\delta^2.$$

This is equivalent to saying, we have $\|\hat{x}-x\|_2 \leq C\sqrt{s}\delta$.

Second, consider Class 2, where the image X satisfies Assumption 2.2 and the encoder is $Q_{2D}$. For simplicity, assume the patch number is 1 (there is only one patch identical to the original image). Results for larger patch numbers are similar. The following theorem establishes the error bound for 2D reconstruction of X from its quantization $Q_{2D}(X)$ using (2.6).

Theorem 3.3 If the original matrix X satisfies Assumption 2.2, let $\hat{X}$ be a solution to (2.6), then $$\|\hat{X}-X\|_F \leq C\sqrt{s}\delta. \tag{3.3}$$

Denote $H_1 = D^T(\hat{X}-X)$, $H_2 = (\hat{X}-X)D$, $S_A$ and $S_B$ are the support sets of $D^T X$ and $XD$ respectively, the corresponding complement sets are $S_A^c$ and $S_B^c$, respectively. By assumption, $|S_A|+|S_B| \leq s$. Also notice that $$\|D^T X\|_1 + \|XD\|_1 \geq \|D^T \hat{X}\|_1 + \|\hat{X}D\|_1 = \|D^T X + H_1\|_1 + \|XD + H_2\|_1 \geq \|D^T X\|_1 - \|(H_1)_{S_A}\|_1 + \|(H_1)_{S_A^c}\|_1 + \|XD\|_1 - \|(H_2)_{S_B}\|_1 + \|(H_2)_{S_B^c}\|_1$$

which gives $\|(H_1)_{S_A^c}\|_1 + \|(H_2)_{S_B^c}\|_1 \leq \|(H_1)_{S_A}\|_1 + \|(H_2)_{S_B}\|_1$, hence $$\|H_1\|_1 + \|H_2\|_1 \leq 2(\|(H_1)_{S_A}\|_1 + \|(H_2)_{S_B}\|_1) \leq Cs\delta.$$

Here the last inequality is due to $\|H_1\|_\infty = \|D^T D(D^{-1}(\hat{X}-X)D^{-T})D^T\|_\infty \leq 8\delta$, similarly, $\|H_2\|_\infty \leq 8\delta$. Then one has the following constraints:

$$\|D^T(\hat{X}-X)\|_1 \leq Cs\delta, \|D^{-1}(\hat{X}-X)\|_\infty \leq 2\delta.$$

Similar to the proof of Theorem 3.1, the inequalities above lead to $$\|\hat{X}-X\|_F = \langle D^T(\hat{X}-X), D^{-1}(\hat{X}-X) \rangle^{\frac{1}{2}} \leq C\sqrt{s}\delta,$$

then (3.3) also holds.

Third, consider reconstruction of images with minimum separation condition (Class 3), where the image X satisfies Assumption 2.3. Same as in Class 1, use $Q_{col}$ (column by column quantization) for encoding.

For $x \in \mathbb{R}^N$, $q=Q^{\Sigma\Delta,\beta}(x)$, β=1 or 2, r≥β, denote v as the last r rows of $D^{-r}(x-q)$, then (2.7) reduces to $$\hat{x} = \arg\min_z \|D_1^\beta z\|_1 \text{ st.} \|D^{-r}(z-q)\|_\infty \leq \delta/2, \tag{3.4}$$

$$\|(D^{-r}(z-q))_{N-r:N-1} - v\|_\infty < \left(\frac{1}{2N}\right)^r \delta.$$

There are two differences between this decoder and that for Class 1: 1) here $D_1$ is the circulant difference matrix instead of the forward difference matrix. This is to ensure that the separation condition is satisfied at the boundary; and 2) in order for the extra separation assumption to improve the error bound over Class 1, one needs to use a few more bits to encode the boundary pixels. The total number of boundary bits is of order O(log N), which is negligible comparing to the O(N) bits needed for the interior pixels.

Theorem 3.4 For high order $\Sigma\Delta$ quantization, i.e., r≥2, assume $D_1^\beta x$ satisfies $\Lambda_M$-minimization separation condition, and $\hat{x}$ is a solution to (3.4), then for arbitrary resolution L≤N/2, the following error bound holds:

$$\|P_L(\hat{x}-x)\|_\infty \leq C\frac{L^2}{N^r}M^{r+\beta-2}\delta. \tag{3.5}$$

Here $P_L$ is the projection onto the low frequency domain with bandwidth L, i.e., $P_L = F_L^* F_L$ with $F_L$ being the first L rows of DFT matrix.

Again, since the image X is sliced into columns and reconstructed individually, if X satisfies Assumption 2.3, let $\hat{X}$ be the reconstructed image concatenated from individual columns which are solutions to (3.4), the infinity norm error bound for decoder (2.7) is then $$\|P_L(\hat{X}-X)\|_\infty \leq C\frac{L^2}{N^r}M^{r+\beta-2}\delta,$$

note that $\|\cdot\|_\infty$ is the element-wise $\ell_\infty$ norm. Substitute L with N/2, obtain $$\|\hat{X}-X\|_F \leq C\frac{M^{r+\beta-2}}{N^{r-3}}\delta.$$

Consider using decoder (3.4) only when the gradients of each column satisfies minimum separation condition, i.e., for all i=1,2, ..., N, $D_1^\beta x_i \in \mathbb{R}^N$ satisfies minimum separation condition with some small constant M≪N. In this case, the worst case $\ell_\infty$-norm error bound for arbitrary resolution approximates 0 when r→∞.

In order to prove Theorem 3.4, super-resolution analysis is performed within the Sigma Delta reconstructions and adjust the analysis to fit in a discrete setting. First, one needs the following lemma.

Lemma 3.7—For feasible $\hat{x} \in \mathbb{R}^N$ which satisfies the constraints in (3.4), the following inequality holds:

$$\|\mathcal{P}_M D_1^\beta (\hat{x} - x)\|_2 \lesssim (MN)^{r+\beta} \sqrt{N} \delta.$$

Recall that for $z \in \mathbb{R}^N$, discrete Fourier transform $$\mathcal{F}_k z = \sum_{n=0}^{N-1} z_n e^{-i2\pi \frac{kn}{N}}.$$

For nonzero frequency $k \neq 0$, denote $$\alpha = \frac{1}{1 - e^{-i2\pi \frac{k}{N}}},$$

then one has $$\mathcal{F}_k D_1 z = \sum_{n=0}^{N-1} (D_1 z)_n e^{-i2\pi \frac{kn}{N}} = \left(1 - e^{-i2\pi \frac{k}{N}}\right) \mathcal{F}_k z = \alpha^{-1} \mathcal{F}_k z. \text{ Also,}$$

$$\mathcal{F}_k D^{-1} z = \sum_{n=0}^{N-1} \left(\sum_{j=0}^{n} z_j\right) e^{-i2\pi \frac{kn}{N}} = \sum_{n=0}^{N-1} z_n \sum_{j=n}^{N-1} e^{-i2\pi \frac{kj}{N}} =$$

$$\frac{1}{1 - e^{-i2\pi \frac{k}{N}}} \sum_{n=0}^{N-1} z_n \left(e^{-i2\pi \frac{kn}{N}} - 1\right) = \alpha \mathcal{F}_k z - \alpha (D^{-1} z)_{N-1}.$$

Similarly, $$\mathcal{F}_k D^{-2} z = a \mathcal{F}_k D^{-1} z - a(D^{-2} z)_{N-1} = a^2 \mathcal{F}_k z - a^2$$
$$(D^{-1} z)_{N-1} - a(D^{-2} z)_{N-1}, \mathcal{F}_k D^{-3} z = a^3 \mathcal{F}_k z - a^3$$
$$(D^{-1} z)_{N-1} - a^2 (D^{-2} z)_{N-1} - a(D^{-3} z)_{N-1}.$$

More generally, for $\beta = 1$ or $2$, $r \geq 2$, $$\mathcal{F}_k D^{-r} z = \alpha^r \mathcal{F}_k z - \alpha^r (D^{-1} z)_{N-1} - \alpha^{r-1} (D^{-2} z)_{N-1} - \cdots - \alpha (D^{-r} z)_{N-1}$$

$$= \alpha^{r+\beta} \mathcal{F}_k D_1^\beta z - \alpha^r (D^{-1} z)_{N-1} - \alpha^{r-1} (D^{-2} z)_{N-1} - \cdots - \alpha (D^{-r} z)_{N-1}.$$

Multiplying $a^{-(r+\beta)}$ on both sides and rearranging the terms gives, $$\mathcal{F}_k D_1^\beta z = \left(1 - e^{-i2\pi \frac{k}{N}}\right)^{r+\beta} \mathcal{F}_k D^{-r} z + \left(1 - e^{-i2\pi \frac{k}{N}}\right)^\beta (D^{-1} z)_{N-1} +$$
$$\left(1 - e^{-i2\pi \frac{k}{N}}\right)^{\beta+1} (D^{-2} z)_{N-1} + \cdots + \left(1 - e^{-i2\pi \frac{k}{N}}\right)^{\beta+r-1} (D^{-r} z)_{N-1}.$$

Note that for $k=0$, $\mathcal{F}_0 D_1^\beta z = \sum_{n=0}^{N-1} (D_1^\beta z)_n = 0$. Then the equation above holds for all $z \in \mathbb{R}^N$ and integer $k$ with $0 \leq |k| \leq N/2$, denote $\Lambda \in \mathbb{C}^{2M+1, 2M+1}$ as the diagonal matrix with diagonal entries being $$1 - e^{-i2\pi \frac{k}{N}}, -M \leq k \leq M,$$

obtain the matrix form of the equations above $$F_M D_1^\beta z = \Lambda^{r+\beta} F_M D^{-r} z + \Lambda^\beta (D^{-1} z)_{-1} 1 + \Lambda^{\beta+1}$$
$$(D^{-2} z)_{N-1} 1 + \ldots + \Lambda^{\beta+r-1} (D^{-r} z)_{N-1} 1 = \Lambda^{r+\beta} F_M$$
$$D^{-r} z + \Sigma_{80=1}^r \Lambda^{\beta+\lambda-1} (D^{-\lambda} z)_{N-1}.$$

Recall that $F_M$ contains the rows of DFT matrix with frequency within $\{-L, -L+1, \ldots, L\}$. Multiplying $$\frac{1}{N} F_M^*$$

on both sides of and replace $z$ with $z = \hat{x} - x$, it gives $$P_M D_1^\beta (\hat{x} - x) =$$
$$\frac{1}{N} F_M^* \Lambda^{r+\beta} F_M D^{-r} (\hat{x} - x) + \sum_{\ell=1}^r \frac{1}{N} F_M^* \Lambda^{\beta+\ell-1} (D^{-\ell} (\hat{x} - x))_{N-1}.$$

Note that $$\left|1 - e^{-i2\pi \frac{k}{N}}\right| \leq 2\pi \frac{|k|}{N} \leq 2\pi \frac{M}{N}, \text{ hence } \left\|\frac{1}{N} F_M^* \Lambda^\ell\right\|_2 \lesssim \frac{1}{\sqrt{N}} \left(\frac{M}{N}\right)^\ell,$$

the following error bound in $\ell_2$ norm holds $$\|P_M D_1^\beta (\hat{x} - x)\|_2 \leq \left\|\frac{1}{N} F_M^* \Lambda^{r+\beta} F_M\right\|_2 \|D^{-r} (\hat{x} - x)\|_2 +$$
$$\sum_{\ell=1}^r \left\|\frac{1}{N} F_M^* \Lambda^{\beta+\ell-1}\right\|_2 \sqrt{M} |D^{-\ell} (\hat{x} - x)_{N-1}| \lesssim \left(\frac{M}{N}\right)^{r+\beta} \sqrt{N} \delta +$$
$$\sum_{\ell=1}^r \left(\frac{M}{N}\right)^{\beta+\ell-\frac{1}{2}} \cdot 2^r \left(\frac{1}{2N}\right)^r \delta \lesssim \left(\frac{M}{N}\right)^{r+\beta} \sqrt{N} \delta.$$

Therefore the low frequency error $P_M D_1^\beta (\hat{x} - x)$ decreases with the $\Sigma\Delta$ quantization order $r$. Denote $h = D_1^\beta (\hat{x} - x)$, divide $h$ into two parts based on whether the location of each entry is within a neighbor of some support of $D_1^\beta x$.

For simplicity of proof, one can view the vectors $x, \hat{x}, h \in \mathbb{R}^N$ as signals on $[0,1]$ sampled at grid $t_n = n/N, n=0, 1, \ldots N-1$. For $D_1^\beta x$ satisfying $\Lambda_M$-minimum separation condition with support set $S = \{\xi_1, \xi_2, \ldots, \xi_s\} \subset [0,1]$, define $$S_M(j) = \{x \in [0,1] : |x - \xi_j| \leq 0.16 M^{-1}\}, j=1, 2, \ldots, s,$$

and $$S_M = U_{j=1}^s S_M(j), S_M^c = [0,1] \backslash S_M.$$

Then the following lemma holds.

Lemma 3.8 If $D_1^\beta x$ satisfying $\Lambda_M$-minimum separation condition, with definitions above, there exists a constant $C > 0$ such that the following hold $$\Sigma_{t_n \in S_M^c} |h_n| \leq C \sqrt{N} \|P_M h\|_2, \quad (3.6)$$

$$\Sigma_j \Sigma_{t_n \in S_M(j)} |h_n| |t_n - s_j|^2 \leq C M^{-2} \sqrt{N} \|P_M h\|_2. \quad (3.7)$$

Denote the restriction of $h$ to a set $S$ as $P_S h$, and $P_S h(\xi_j) = |P_S h(\xi_j)| e^{i\Phi j}$, $j=1, 2, \ldots, s$. By Lemma 6.1, take $v_j = e^{i\Phi j}$, $j=1, 2 \ldots s$, there exists $f(t) = \Sigma_{k=-M}^M c_k e^{i2\pi kt}$ defined in $[0,1]$ and constant $C_1, C_2$ such that $$f(t_j) = e^{i\Phi j}, j=1, 2 \ldots s, \quad (3.8)$$

$$|f(t)| \leq 1 - C_1 M^2 (t - \xi_j)^2, t \in S_M(j), \quad (3.9)$$

$$|f(t)| < 1 - C_2, t \in S_M^c. \quad (3.10)$$

Denote $f_n = f(t_n)$ where $t_n = n/N$, $n = 0, 1, \ldots, N-1$, then $$\sum_{t_n \in S} |h_n| = \left|\sum_{t_n \in S} \bar{f}_n h_n\right|$$

$$\leq \left|\sum_{n=0}^{N-1} \bar{f}_n h_n\right| + \left|\sum_{t_n \in S_M^c} \bar{f}_n h_n\right| + \left|\sum_j \sum_{t_n \in S_M(j)\setminus\{s_j\}} \bar{f}_n h_n\right|$$

$$\leq \left|\sum_{n=0}^{N-1} \bar{f}_n h_n\right| + (1-C_2) \sum_{t_n \in S_M^c} |h_n| +$$

$$\sum_j \sum_{t_n \in S_M(j)} (1 - C_1 M^2 (t_n - \xi_j)^2)|h_n|$$

$$= \left|\sum_{n=0}^{N-1} \bar{f}_n h_n\right| + \sum_{t_n \in S^c} |h_n| - C_2 \sum_{t_n \in S_M^c} |h_n| -$$

$$C_1 M^2 \sum_j \sum_{t_n \in S_M(j)} (t_n - \xi_j)^2 |h_n|$$

Rearrange the inequality, one obtains $$C_2 \sum_{t_n \in S_M^c} |h_n| + C_1 M^2 \sum_j \sum_{t_n \in S_M(j)} (t_n - \xi_j)^2 |h_n| \leq \quad (3.11)$$

$$\left|\sum_{n=0}^{N-1} \bar{f}_n h_n\right| + \sum_{t_n \in S^c} |h_n| - \sum_{t_n \in S} |h_n|.$$

Note that $|\Sigma_{n=0}^{N-1} \bar{f}_n h_n| = |\langle f, h \rangle| = |\langle f, P_M h \rangle| \leq \|f\|_2 \|P_M h\|_2 \leq \sqrt{N} \|P_M h\|_2$, also note that $\hat{x}$ is a solution of (3.4), so $$\|D_1^\beta x\|_1 \geq \|D_1^\beta \hat{x}\|_1 = \|D_1^\beta x + h\|_1 \geq \sum_{t_n \in S} |(D_1^\beta x)_n| - \sum_{t_n \in S} |h_n| + \sum_{t_n \in S^c} |h_n|,$$

then $$\sum_{t_n \in S^c} |h_n| - \sum_{t_n \in S} |h_n| \leq 0.$$

then (3.11) becomes $$C_2 \Sigma_{t_n \in S_M^c} |h_n| + C_1 M^2 \Sigma_j \Sigma_{t_n \in S_M(j)} (t_n - \xi_j)^2 |h_n| \leq \sqrt{N} \|P_M h\|_2.$$

From this inequality we can derive (3.6) and (3.7).

Next, bound $\|K * D_1^\beta (\hat{x} - x)\|_\infty$ for arbitrary kernel $K$ with period 1.

For arbitrary $$x_0 \in \left\{0, \frac{1}{N}, \ldots, \frac{N-1}{N}\right\},$$

$$|K*h(x_0)| = |\Sigma_{n=0}^{N-1} K(x_0 - t_n) h_n| \leq |\Sigma_j \Sigma_{t_n \in S_M(j)} K(x_0 - t_n) h_n| + \|K\|_\infty \Sigma_{t_n \in S_M^c} |h_n|. \quad (3.12)$$

On the interval $S_M(j)$, approximate $K(x_0 - t_n)$ with its first-order Taylor expansion around $x_0 - \xi_j$:

$$K(x_0 - t_n) = K(x_0 - \xi_j) + K'(x_0 - \xi_j)(\xi_j - t_n) + \tfrac{1}{2} K''(\mu_n) |t_n - \xi_j|^2, x \in S_M(j),$$

with some $\mu_n \in S_M(j)$ depending on $x_0, s_j, x$. Inserting this into (3.12), one obtains $$|K*h(x_0)| \leq \left|\sum_j \sum_{t_n \in S_M(j)} (K(x_0 - \xi_j) - K'(x_0 - \xi_j)(t_n - \xi_j)) h_n\right| +$$

$$\|K''\|_\infty \sum_j \sum_{t_n \in S_M^c} |t_n - \xi_j|^2 |h_n| + \|K\|_\infty \sum_{t_n \in S_M^c} |h_n|.$$

To bound the first term on the right hand side, use an interpolation argument. Let $a, b \in \mathbb{C}^S$ such that $a_j = K(x_0 - \xi_j)$, $b_j = -K'(x_0 - \xi_j)$ and by Proposition 2.4 in [15], there exists a function $f \in C([0,1], \Lambda_M)$ such that $$\|f\|_\infty \lesssim \|K\|_\infty + M^{-1}\|K'\|_\infty, |f(x) - a_j - b_j(x - \xi_j)| \lesssim (M^2\|K\|_\infty + M\|K'\|_\infty)|x - \xi_j|^2, x \in S_M(j).$$

which gives $$\left|\sum_j \sum_{t_n \in S_M(j)} (K(x_0 - \xi_j) - K'(x_0 - \xi_j)(t_n - \xi_j)) h_n\right| \leq$$

$$\left|\sum_j \sum_{t_n \in S_M(j)} (f(t_n) - K(x_0 - \xi_j) + K'(x_0 - \xi_j)(t_n - \xi_j)) h_n\right| + \left|\sum_{t_n \in S_M} f_n h_n\right| \lesssim$$

$$(M^2 \|K\|_\infty + M\|K'\|_\infty) \sum_j \sum_{t_n \in S_M(j)} |t_n - \xi_j|^2 |h_n| + \left|\sum_{n=0}^{N-1} f_n h_n\right| + \left|\sum_{n \in S_M^c} f_n h_n\right|$$

Also, obtain $$|\Sigma_{t_n \in S_M^c} f_n h_n| \lesssim (\|K\|_\infty + M^{-1}\|K'\|_\infty) \Sigma_{t_n \in S_M^c} |h_n|$$
$$|\Sigma_{n=0}^{N-1} f_n h_n| \leq \|f\|_2 \|P_M h\|_2 \lesssim (\|K\|_\infty + M^{-1}\|K'\|_\infty) \sqrt{N} \|P_M h\|_2.$$

Combining these results, one obtains $$|K*h(x_0)| \lesssim (2\|K\|_\infty + M^{-1}\|K'\|_\infty) \Sigma_{t_n \in S_M^c} |h_n| + (\|K\|_\infty + M^{-1}\|K'\|_\infty) \sqrt{N} \|P_M h\|_2 + (M^2\|K\|_\infty + M\|K'\|_\infty + \|K''\|_\infty) \Sigma_j \Sigma_{t_n \in S_M(j)} |t_n - \xi_j|^2 |h_n| \lesssim (\|K\|_\infty + M^{-1}\|K'\|_\infty + M^{-2}\|K''\|_\infty) \sqrt{N} \|P_M h\|_2 \quad (3.13)$$

Next, for arbitrary resolution $L$, denote $$K_L(x) = \frac{1}{N} \sum_{k=-L, k\neq 0}^{L} e^{i2\pi k x},$$

then by direct calculation one obtains $$P_L(\hat{x} - x) = K_L * (\hat{x} - x) + \frac{1}{N} \sum_{n=0}^{N-1} (\hat{x} - x)_n 1,$$

$$\|P_L(\hat{x} - x) - K_L * (\hat{x} - x)\|_\infty < \frac{1}{N^r}.$$

Here the last equation is due to the constraint in (3.4) which forces the absolute value of the last $r$ rows in $D^{-r}(\hat{x} - x)$ to be smaller than $$2 * \left(\frac{1}{2N}\right)^r,$$

then $$\left|\sum_{n=0}^{N-1}(\hat{x}-x)_n\right| = |(D^{-1}(\hat{x}-x))_{N-1}| = 2^{r-1}\|D^{-r}(\hat{x}-x)_{N-r:N-1}\|_\infty \le \left(\frac{1}{N}\right)^r.$$

In the following, the goal is to bound the infinity norm $\|K_L*(\hat{x}-x)\|_\infty$. Consider TV order=1. For $K_L(x)$, construct a corresponding function $\tilde{K}_L(x)$, $x \in [0,1]$, which satisfies $D_1\tilde{K}(t_j)=K_L(t_j)$ for all $j=0,1,\ldots,N-1$. Then one can bound $\|K_L*(\hat{x}-x)\|_\infty$ by $$\|K_L*(\hat{x}-x)\|_\infty = \|D_1\tilde{K}_L*(\hat{x}-x)\|_\infty = \|\tilde{K}_L*D_1(\hat{x}-x)\|_\infty = \|\tilde{K}_L*h\|_\infty,$$

which can be further bounded by (3.13). Consider $$\tilde{K}_L(x) = \frac{1}{N}\sum_{k=-L,k\ne 0}^{L} \frac{1-e^{i2\pi k(x+\frac{1}{N})}}{1-e^{i2\pi\frac{k}{N}}},$$

see that $$\tilde{K}_L(t_j) = \frac{1}{N}\sum_{k=-L,k\ne 0}^{L} \frac{1-e^{i2\pi k\frac{j+1}{N}}}{1-e^{i2\pi\frac{k}{N}}} = \frac{1}{N}\sum_{k=-L,k\ne 0}^{L}\sum_{n=0}^{j} e^{i2\pi k\frac{n}{N}} = \sum_{n=0}^{j} K_L(t_n),$$

$$j = 0, 1, \ldots, N-1.$$

So it satisfies the desired property $$D_1\tilde{K}_L(t_j) = \tilde{K}_L(t_j) - \tilde{K}_L(t_{j-1}) = K_L(t_j).$$

Now show that the infinity norm of $\tilde{K}_L(x)$ is bounded by some constant for arbitrary $L \le N/2$ and $x \in [0,1]$. Since $e^{i2\pi kx}$ is 1-periodic, one has $$\sup_x \tilde{K}_L(x) = \frac{1}{N}\sup_x \sum_{k=-L,k\ne 0}^{L} \frac{1-e^{i2\pi kx}}{1-e^{i2\pi\frac{k}{N}}} =$$

$$\frac{1}{N}\sup_x \sum_{k=1}^{L} \frac{1-\cos(2\pi kx)-i\sin(2\pi kx)}{1-\cos(2\pi\frac{k}{N})-i\sin(2\pi\frac{k}{N})} + \frac{1-\cos(2\pi kx)+i\sin(2\pi kx)}{1-\cos(2\pi\frac{k}{N})+i\sin(2\pi\frac{k}{N})} =$$

$$\frac{1}{N}\sup_x \sum_{k=1}^{L} \frac{(1-\cos(2\pi kx))(1-\cos(2\pi\frac{k}{N}))+\sin(2\pi kx)\sin(2\pi\frac{k}{N})}{1-\cos(2\pi\frac{k}{N})} =$$

$$\frac{1}{N}\sup_x \sum_{k=1}^{L} (1-\cos(2\pi kx)) + \frac{\sin(2\pi kx)\cos(\pi\frac{k}{N})}{\sin(\pi\frac{k}{N})} =$$

$$\frac{L}{N} + \frac{1}{N}\sup_x \sum_{k=1}^{L} \frac{\sin(2\pi kx)\cos(\pi\frac{k}{N}) - \sin(\pi\frac{k}{N})\cos(2\pi kx)}{\sin(\pi\frac{k}{N})} =$$

$$\frac{L}{N} + \frac{1}{N}\sup_x \sum_{k=1}^{L} \frac{\sin(2\pi k(x-\frac{1}{2N}))}{\sin(\pi\frac{k}{N})} = \frac{L}{N} + \frac{1}{N}\sup_x \sum_{k=1}^{L} \frac{\sin(2\pi kx)}{\sin(\pi\frac{k}{N})}$$

Notice that for $k \le L \le N/2$, $$\pi\frac{k}{N} \le \frac{\pi}{2},$$

then $$\sin\left(\pi\frac{k}{N}\right)$$

is of the same order as $$\pi\frac{k}{N}$$

since for all $$0 < x \le \frac{\pi}{2}, x - \frac{x^3}{6} \le \sin(x) < x,$$

which further gives $$0.58\pi\frac{k}{N} \le \pi\frac{k}{N} - \left(\pi\frac{k}{N}\right)^3/6 \le \sin\left(\pi\frac{k}{N}\right) < \pi\frac{k}{N}.$$

Then see that $$\left|\frac{1}{N}\sum_{k=1}^{L}\frac{\sin(2\pi kx)}{\sin(\pi\frac{k}{N})} - \sum_{k=1}^{L}\frac{\sin(2\pi kx)}{\pi k}\right| = \frac{1}{N}\sum_{k=1}^{L}\sin(2\pi kx)\left(\frac{1}{\sin(\pi\frac{k}{N})} - \frac{1}{\pi\frac{k}{N}}\right) =$$

$$\frac{1}{N}\sum_{k=1}^{L}\sin(2\pi kx)\frac{\pi\frac{k}{N}-\sin(\pi\frac{k}{N})}{\sin(\pi\frac{k}{N})\pi\frac{k}{N}} \le \frac{1}{N}\sum_{k=1}^{L}\frac{\frac{1}{6}(\pi\frac{k}{N})^3}{0.58(\pi\frac{k}{N})^2} \le 0.23.$$

It is known that the summation $$\sum_{k=1}^{n}\frac{\sin(2\pi kx)}{k}$$

is uniformly bounded by some constant smaller than 2 for arbitrary $n \in \mathbb{N}$ and $x \in \mathbb{R}$, so $\tilde{K}_L(x)$ is also bounded, there exists some constant C such that $\|\tilde{K}_L\|_\infty \le C$. Therefore by (3.13) one has, $$\|K_L*(\hat{x}-x)\|_\infty \le \|D_1\tilde{K}_L*(\hat{x}-x)\|_\infty =$$

$$\|\tilde{K}_L*h\|_\infty \le C\frac{L^2}{M^2}\sqrt{N}\cdot\frac{M^{r+1}}{N^{r+\frac{1}{2}}}\delta = C\frac{L^2}{N}\left(\frac{M}{N}\right)^{r-1}\delta.$$

For the last inequality, Bernstein's Inequality is used for trigonometric sums to obtain $\|\tilde{K}_L\|_\infty \le C$, $\|\tilde{K}_L\|\tilde{K}_L'\|_\infty \le CL^2$.

For TV order=2, consider $$\tilde{K}_L(x) = -\frac{1}{N} \sum_{k=-L,k\neq 0}^{L} \frac{e^{i2\pi\frac{k}{N}} - e^{i2\pi k\left(\frac{2}{N}+x\right)}}{(1-e^{i2\pi\frac{k}{N}})^2},$$

similarly, one can show $\|\tilde{K}\|_\infty \leq N$, then $$\|K_L * (\hat{x} - x)\|_\infty \leq \|D_1^2 \tilde{K}_L * (\hat{x} - x)\|_\infty =$$

$$\|\tilde{K}_L * h\|_\infty \leq C\frac{L^2}{M^2} N^{\frac{3}{2}} \cdot \frac{M^{r+2}}{N^{r+\frac{3}{2}}} \delta = CL^2 \left(\frac{M}{N}\right)^r \delta.$$

In conclusion, for $\beta=1$ or 2, one has have the $\ell_\infty$-norm error bound $$\|K_L * (\hat{x} - x)\|_\infty \leq C \frac{L^2}{N^r} M^{r+\beta-2} \delta,$$

which further gives $$\|P_L(\hat{x}-x)\|_\infty \leq \|K_L*(\hat{x}-x)\|_\infty + \left\|\frac{1}{N}\sum_{n=0}^{N-1}(\hat{x}-x)_n 1\right\|_\infty \leq C\frac{L^2}{N^r} M^{r+\beta-2}\delta.$$

An optimization algorihtm is presenetd for for solving (3.1). Here, the algorithm is presenetd for the simple case when the TV order $\beta$ and the quantization order r are both 1, which reduces (3.1) to $$\min_z \|D^T z\|_1 \text{ subject to } \|D^{-1}(z-q)\|_\infty \leq \delta/2. \quad (4.1)$$

All other optimization problems proposed in this paper can be solved in similar ways.

Let us start with writing out the Lagrangian dual of (4.1)

$$\mathcal{L}(z,y) = \|D^T z\|_1 - \frac{\delta}{2}\|y\|_1 + \langle y, D^{-1}(z-q)\rangle. \quad (4.2)$$

This dual formulation (4.2) is a special case of the general form $$\max_y \min_x \langle Lx, y\rangle + g(x) - f^*(y), \quad (4.3)$$

which is known to be solvable by primal-dual algorithms such as the Chambolle-Pock method (Algorithm 1).

| Algorithm 1: Solve (4.3) using Chambolle-Pock Method |
|---|
| Initializations: $\tau, \sigma > 0$, $\tau\sigma < 1$, $\theta \in [0,1]$, $x_0, y_0$. and set $\bar{x}_0 = x_0$ |
| Iterations: Update $x_n, y_n, \bar{x}_n$ as follows: |
| $\begin{cases} y_{n+1} = \text{Prox}_{\sigma f^*}(y_n + \sigma L\bar{x}_n) & (a) \\ x_{n+1} = \text{Prox}_{\tau g}(x_n - \tau L^* y_{n+1}) & (b) \\ \bar{x}_{n+1} = x_{n+1} + \theta(x_{n+1} - x_n) & (c) \end{cases}$ |

A natural way to apply Chambolle-Pock method on (4.2) is to let $x=D^T z$, $L=D^{-1}D^{-T}$, $g(x)=\|x\|_1$, $$f^*(y) = \frac{\delta}{2}\|y\|_1,$$

then (4.2) becomes $$\mathcal{L}(x,y) = \quad (4.4)$$

$$\|x\|_1 - \frac{\delta}{2}\|y\|_1 + \langle y, D^{-1}D^{-T}x - D^{-1}q\rangle \equiv \langle Lx, y\rangle + g(x) - f^*(y).$$

Although this can be solved by the Chambolle-Pock method (Algorithm 1), it converges pretty slowly due to poor conditioning of L (the condition number of L is $O(N^2)$).

One proposed strategy is, through a change of variable, moving the large condition number from L to g in (4.3). This is beneficial as on the one hand, the improved condition number of L accelerated the convergence of the primal-dual updates; on the other hand, the increased condition number on g is harmless to the inner loop due to the use of the proximal map. Explicitly, the change of variable is through $x=D^{-1}(z-q)$, then $z=Dx+q$, the dual form becomes $$\mathcal{L}(x,y) = \langle y, x\rangle + \|D^T Dx + D^T q\|_1 - \frac{\delta}{2}\|y\|_1. \quad (4.5)$$

Next, let $g(x)=\|D^T Dx + D^T q\|_1$, $$f^*(y) = \frac{\delta}{2}\|y\|_1,$$

one can see that (4.5) also fits into the form of (4.3). Applying Chambolle-Pock Method to solving (4.5), it gives the following algorithm:

| Algorithm 2: Solve (4.5) using Chambolle-Pock Method |
|---|
| Initializations: $\tau, \sigma > 0$, $\tau\sigma < 1$, $\theta \in [0,1]$, $x_0, y_0$. and set $\bar{x}_0 = x_0$ |
| Iterations: Update $x_n, y_n, \bar{x}_n$ as follows: |
| $\begin{cases} y_{n+1} = \text{argmin}_y \frac{\sigma\delta}{2}\|y\|_1 + \frac{1}{2}\|y - (y_n + \sigma\bar{x}_n)\|^2 & (a) \\ x_{n+1} = \tau\|D^T Dx + D^T q\|_1 + \frac{1}{2}\|x - (x_n - \tau y_{n+1})\|^2 & (b) \\ \bar{x}_{n+1} = x_{n+1} + \theta(x_{n+1} - x_n) & (c) \end{cases}$ |

Note that it has been shown that when L=I (I is the identity matrix), step sizes $\tau=1/\sigma$ and extrapolation rate $\theta$ is set to 1, PDHG is equivalent to DRS and ADMM. Hence the above algorithm can also be derived by appropriate applications of the ADMM algorithm when those special step sizes are used.

In Algorithm 2, step (a) has a closed form solution. To solve (b), one can apply ADMM algorithm, the procedure of which is stated in Algorithm 3.

Algorithm 3: Solve (b) in Algorithm 2 by ADMM

Initializations: $\rho > 0$, $x_0$, $u_0$, $b_0$
Iterations: Update $x_n$, $u_n$, $b_n$ as follows:

$$\begin{cases} x_{n+1} = \mathrm{argmin}_x \frac{1}{2}\|x - (x_n - \tau y_{n+1})\|_2^2 + \frac{\rho}{2}\|D^T Dx + D^T q - u_n + b_n\|_2^2 \\ u_{n+1} = \mathrm{argmin}_u \tau\|u\|_1 + \frac{\rho}{2}\|D^T Dx_{n+1} + D^T q - u + b_n\|_2^2 \\ b_{n+1} = b_n + D^T Dx_{n+1} + D^T q - u_{n+1} \end{cases}$$

Figure 6A:
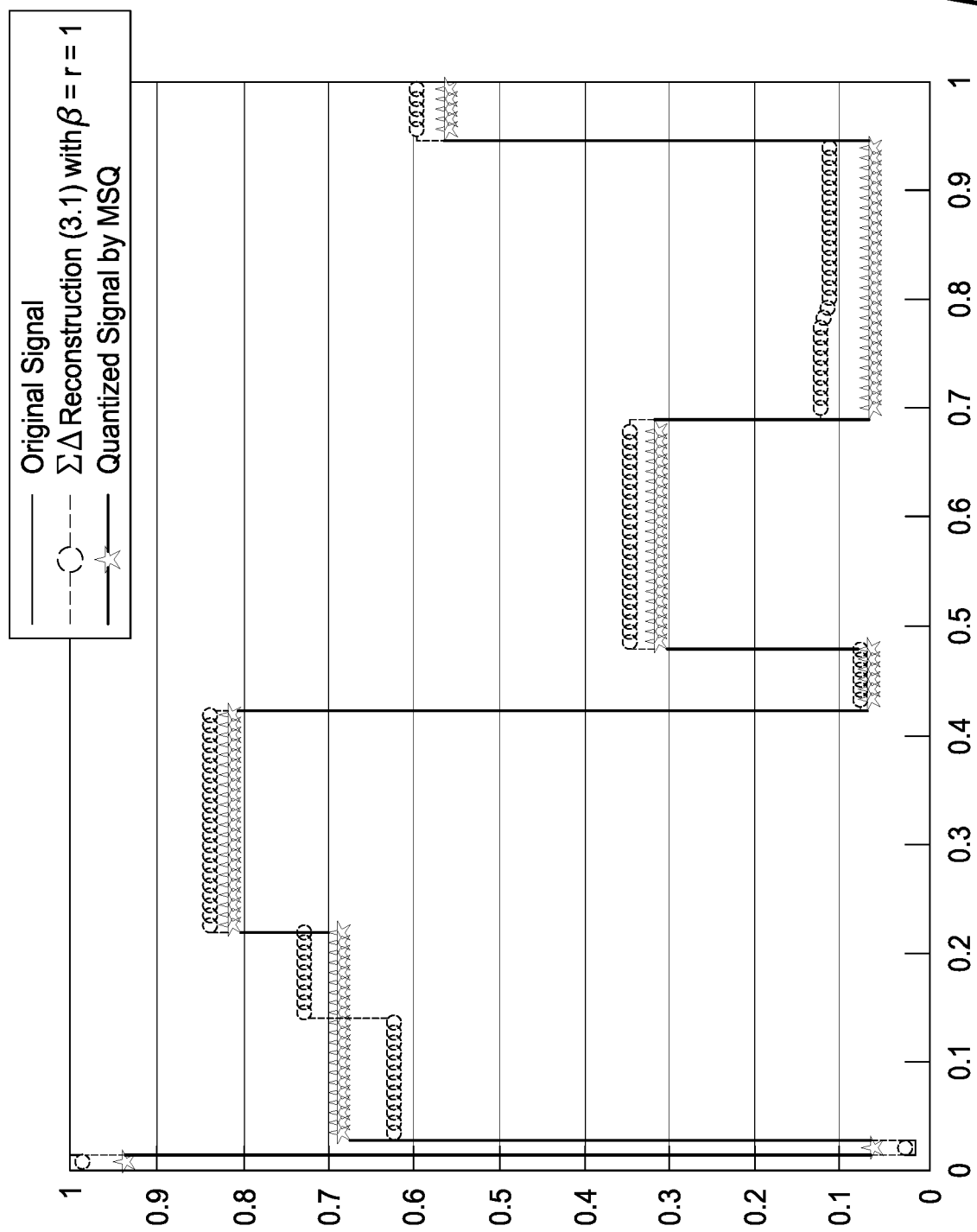
FIGS. 6A-6C are graphs showing a comparison of various 1D signal reconstruction results between the proposed encoder-decoder pairs and MSQ.
Figure 6B:
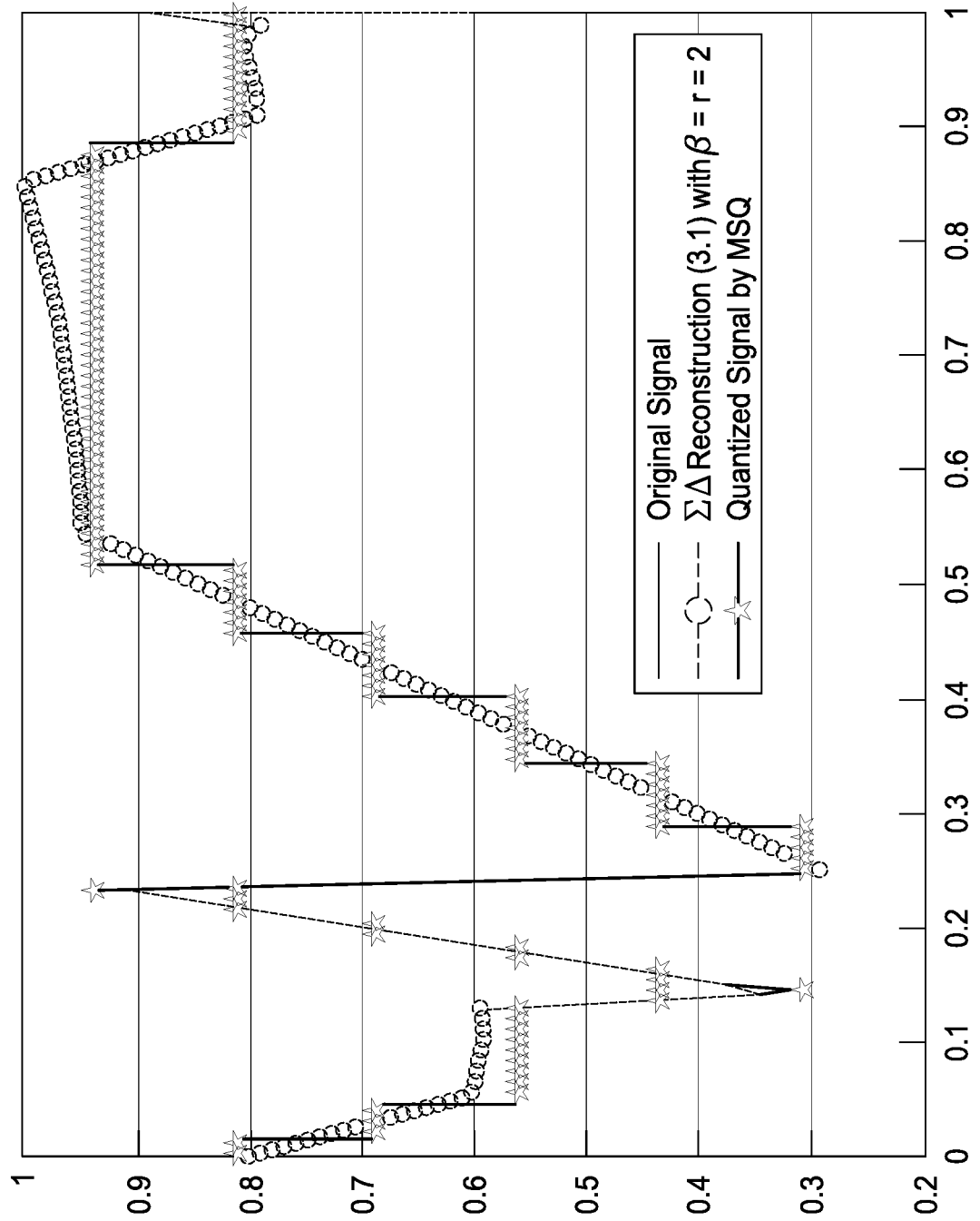
Figure 6C:
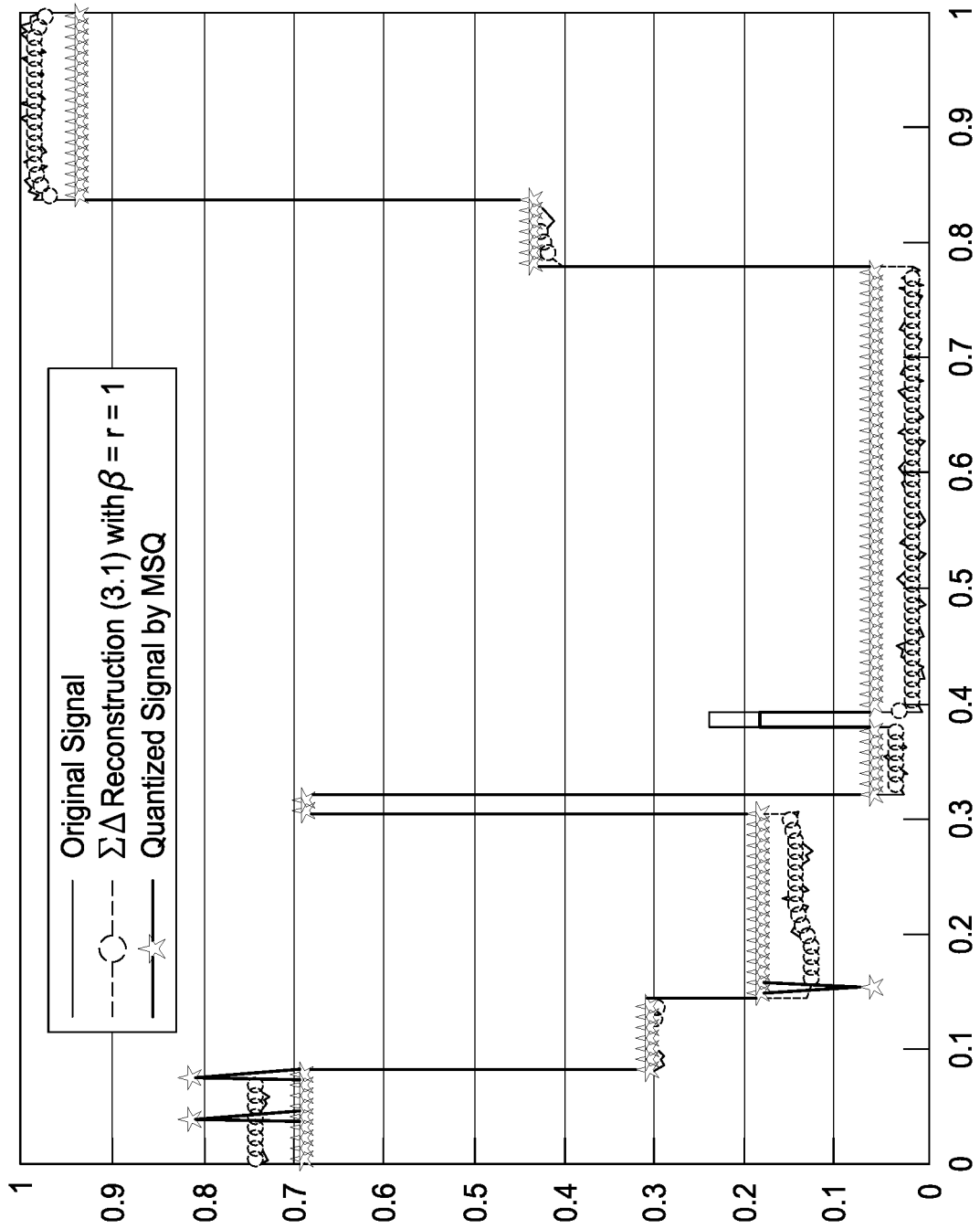

Numerical simulation of the proposed decoder on both 1D synthetic signals and natural images is presented. An experiment is designed to confirm the benefits of the proposed quantization method over MSQ on 1D signals (representing columns of images) proved in Theorem 3.1. The signal to be quantized is piece-wise constant or piece-wise linear with random boundary locations and random height/slope on each piece, which satisfies assumption 2.1. MSQ is compared with Sigma Delta quantization coupled with the decoder (3.1). The result is displayed in FIGS. 6A-6C. In FIG. 6A, MSQ is compared with 1st order Sigma Delta quantization, where the signal is piece-wise constant, not satisfying the minimum separation condition. The decoder used for reconstruction is according to (3.1) with $\beta=1$. The SNR of the reconstructed image from Sigma Delta quantization is 37.00, and the SNR of MSQ is 21.95. In FIG. 6B, MSQ is compared with the 2nd order Sigma Delta quantization and a decoder (3.1) with $\beta=2$. In this case, the SNR of the Sigma Delta reconstruction is 37.30, and the SNR of MSQ is 27.33. In FIG. 6C, the signal is piece-wise constant with random noise. MSQ is compared with the 1st order Sigma Delta quantization and decoder (3.1) with $\beta=1$. The SNR of Sigma Delta reconstruction is 33.40, and SNR of MSQ is 20.93. From FIG. 6A, with the same number of bits, the reconstructed signal using $1^{st}$ order $\Sigma\Delta$ quantization and decoder (3.1) is closer to the true signal and generally preserves the piece-wise constant structure. FIG. 6B shows that the piece-wise linear signal is also better reconstructed by the proposed method. As there is no guarantee that a given signal strictly satisfies our assumption, FIG. 6C tests the stability of the proposed method by adding random noise to the signal. It can be seen that even with additive random noise, the proposed encoder-decoder pair has reasonably good performance.

Figure 7A:
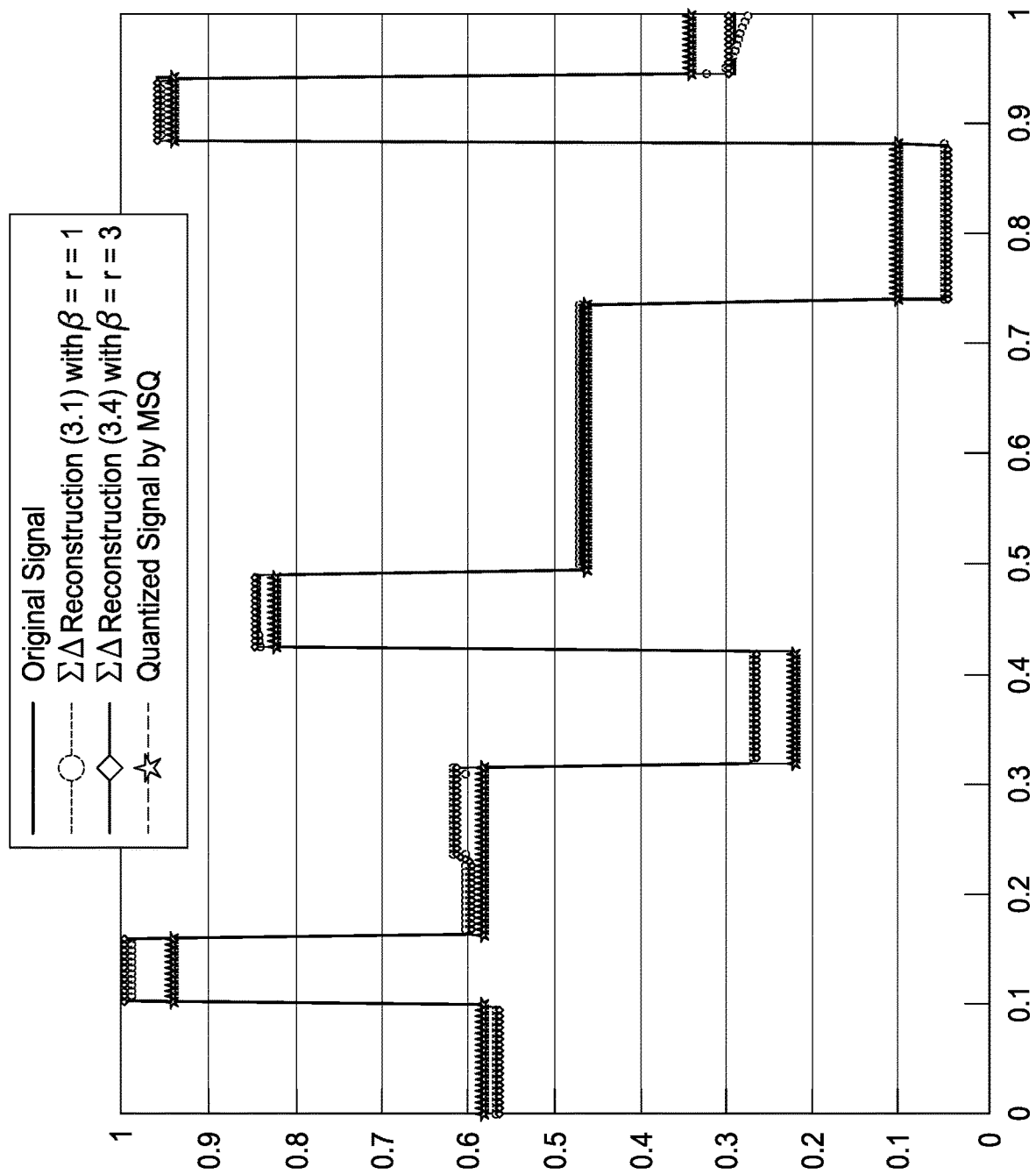
FIGS. 7A and 7B are graphs showing the reconstruction result of signals that satisfy minimum separation condition.
Figure 7B:
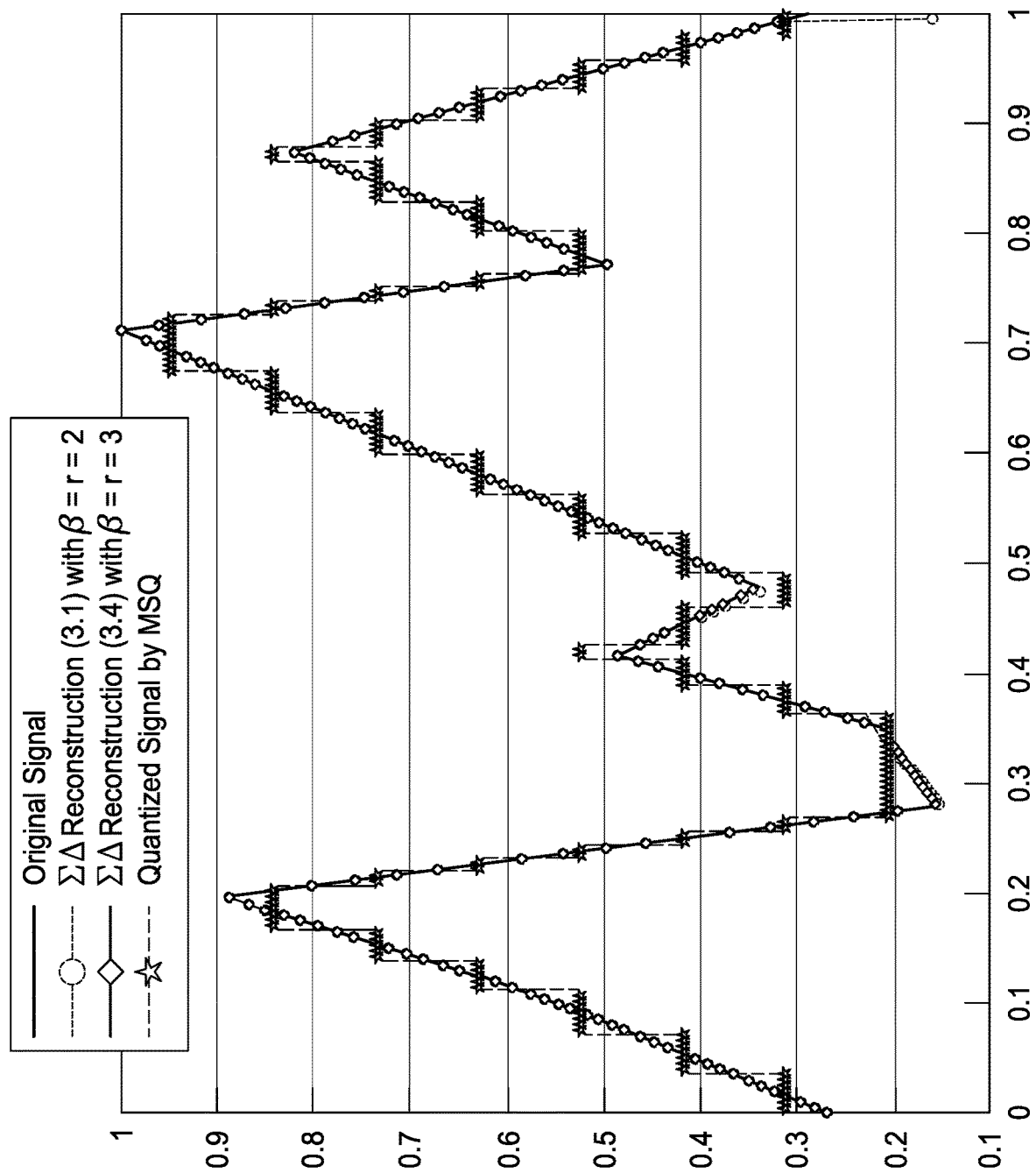

FIGS. 7A and 7B show the reconstruction result of signals that satisfy minimum separation consdition. In FIG. 7A, the signal is piece-wise constant. For Sigma Delta quantization, 1st order Sigma Delta quantization is used and a decoder (3.1) with $\beta=r=1$, as well as 3rd order Sigma Delta quantization and decoder (3.4) with $\beta=1$, $r=3$. The SNR of the reconstructed signals are 41.90 and 33.69, respectively. The SNR of MSQ is 24.13. In FIG. 7B, the signal is piece-wise linear. For Sigma Delta quantization, $2^{nd}$ order Sigma Delta quantization is used and a decoder (3.1) with $\beta=r=2$, as well as $3^{rd}$ order Sigma Delta quantization and a decoder (3.4) with $\beta=2$, $r=3$. The SNR of the reconstructed signals are 47.02 and 36.11, respectively. The SNR of MSQ is 25.70. If the minimum separation condition is met, one can achieve further error reduction by using high order $\Sigma\Delta$ quantization. In both FIGS. 7A and 7B, the reconstructed signal with higher $\Sigma\Delta$ quantization order r is close to the true signal compared the result using lower quantization order, which agrees with the theoretical result in Theorem 3.4.

Numerical results are also presented for 2D natural images. The best performance is usually achieved when both the TV order and the $\Sigma\Delta$ quantization order are 1. This setting is used in the following experiments.

In the first example, gray-scale images are compard with the results of 2D Sigma Delta quantization Q2D coupled with decoder (2.6) (sd2D), 1D Sigma Delta quantization Qcol coupled with decoder (2.5) (sd1D) and the MSQ quantization, all quantization used the same number of bits and the optimal alphabets. In terms of visual quality, (sd2D) is better than (sd1D) and much better than MSQ. In terms of the PSNR, (sd1D) is slightly better than (sd2D) and better than MSQ.

In the second experiment, the effect of dividing the image into multiple rectangle patches is evaluated in (sd2D), quantizing and reconstructing the image individually using the test image Lena. The process can be done in parallel, which makes the decoding process significantly faster than the single patch 2D reconstruction. There is usually no visible difference between using 1 patch and multiple patches in quantization and reconstruction. In both cases, the images look more natural and closer to the original image than MSQ, as the latter is unable to distinguish the subtle difference between pixels, especially in the face and shoulder area.

To further investigate where the improved PSNRs of the two Sigma Delta reconstructions come from, the absolute spectra of the three reconstructions is plotted as well as the absolute spectra of the residue images. The residue image is defined as the difference between the reconstructed image and the original image. As predicted, the decoders can indeed retain the high frequency information while effectively compressing the low frequency noise.

The techniques described herein may be implemented by one or more circuits and/or computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by circuit and/or computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a circuit, a computer system, or combination thereof, that manipulates and transforms data represented as physical (electronic) quantities within the circuit and the computer system memories or registers or other such information storage, transmission or display devices.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for quantizing pixels of an image, comprising:
   receiving, by a sequencing circuit, pixel values for an image captured by a camera, where the pixel values are arranged in a matrix;
   grouping, by the sequencing circuit, the pixel values of the matrix into columns of pixel values;
   for each column in the matrix, quantizing, by an analog to digital converter, pixel values of a given column as a whole using sigma delta modulation thereby minimizing accumulated quantization error for the given column from a starting pixel value in the given column to a current pixel value in the given column; and
   reconstructing a final image from the quantized pixel values of the matrix using a decoder, where the decoder is configured to minimize an image norm subject to a quantization constraint and the quantization constraint is defined by a finite integration operator applied to a quantization error with an L-infinite norm bounded by half of the quantization step-size, wherein the quantization error is a vector such that each element of the vector contains a quantization error for a given pixel in the matrix.

2. The method of claim 1 further comprises quantizing two or more columns of pixel values from the matrix in series using sigma delta modulation.

3. The method of claim 1 further comprises assembling quantized values for each column into a rectangular array and storing the rectangular array as a final image in a non-transitory computer-readable medium.

4. The method of claim 1 wherein the image norm is further defined as a total variation norm.

5. An imaging system, comprising:
   a camera configured to capture an image of a scene, where the image is represented by pixel values arranged in a matrix;
   a sequencing circuit configured to receive the image from the camera and operates to grouping the pixel values of the matrix into columns of pixel values; and
   an analog to digital converter interfaced with the sequencing circuit and, for each column in the matrix, quantizes pixel values of a given column as a whole using sigma delta modulation, thereby minimizing accumulated quantization error for the given column from a starting pixel value in the given column to a current pixel value in the given column; and
   a decoder configured to receive the quantized pixel values of the matrix and reconstructing a final image from the quantized pixel values of the matrix, where the decoder minimizes an image norm subject to a quantization constraint and the quantization constraint is defined by a finite integration operator applied to a quantization error with an L-infinite norm bounded by half of the quantization step-size, and the quantization error is a vector such that each element of the vector contains a quantization error for a given pixel in the matrix.

6. A method for quantizing pixels of an image, comprising:
   receiving, by a sequencing circuit, pixel values for an image captured by a camera, where the pixel values are arranged in a matrix;
   grouping, by the sequencing circuit, the pixel values of the matrix into columns of pixel values;
   for each column in the matrix, quantizing, by an analog to digital converter, pixel values of a given column as a whole using sigma delta modulation thereby minimizing accumulated quantization error for the given column from a starting pixel value in the given column to a current pixel value in the given column; and
   reconstructing, by a decoder, a final image from the quantized pixel values of the matrix while minimizing a norm subject to a quantization constraint, where the quantization constraint is defined by a finite integration operator applied to a quantization error with an L-infinite norm bounded by half of the quantization step-size, and the quantization error is a vector such that each element of the vector contains a quantization error for a given pixel in the matrix.

7. The method of claim 6 further comprises quantizing two or more columns of pixel values from the matrix in parallel using sigma delta modulation.

8. The method of claim 6 further comprises quantizing two or more columns of pixel values from the matrix in series using sigma delta modulation.

9. The method of claim 6 further comprises assembling quantized values for each column into a rectangular array and storing the rectangular array as a final image in a non-transitory computer-readable medium.

10. The method of claim 6 wherein the norm is further defined as a total variation norm.

* * * * *